(12) United States Patent
Huang

(10) Patent No.: US 12,165,915 B2
(45) Date of Patent: Dec. 10, 2024

(54) SEMICONDUCTOR DEVICE CONTACT AND METHOD OF MAKING SAME

(71) Applicant: TAIWAN SEMICONDUCTOR MANUFACTURING COMPANY, LTD., Hsinchu (TW)

(72) Inventor: Yu-Lien Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 389 days.

(21) Appl. No.: 17/527,936

(22) Filed: Nov. 16, 2021

(65) Prior Publication Data

US 2022/0367256 A1 Nov. 17, 2022

Related U.S. Application Data

(60) Provisional application No. 63/188,168, filed on May 13, 2021.

(51) Int. Cl.
| | |
|---|---|
| H01L 21/768 | (2006.01) |
| H01L 23/522 | (2006.01) |
| H01L 23/528 | (2006.01) |
| H01L 29/40 | (2006.01) |
| H01L 29/423 | (2006.01) |

(52) U.S. Cl.
CPC .... *H01L 21/76831* (2013.01); *H01L 23/5226* (2013.01); *H01L 23/5283* (2013.01); *H01L 29/401* (2013.01); *H01L 29/4236* (2013.01)

(58) Field of Classification Search
CPC ........... H01L 21/76831; H01L 23/5226; H01L 23/5283; H01L 21/76844; H01L 21/76843
See application file for complete search history.

(56) References Cited

U.S. PATENT DOCUMENTS

| | | | |
|---|---|---|---|
| 10,700,208 B2 * | 6/2020 | Chang | H01L 21/76879 |
| 2017/0170290 A1 * | 6/2017 | Basker | H01L 29/665 |
| 2018/0151474 A1 * | 5/2018 | Chen | H01L 23/481 |
| 2018/0308797 A1 * | 10/2018 | Tsai | H01L 23/5283 |
| 2019/0164824 A1 * | 5/2019 | Wang | H01L 21/32134 |
| 2020/0043777 A1 * | 2/2020 | Kung | H01L 21/76877 |
| 2022/0310444 A1 * | 9/2022 | Chong | H01L 23/5283 |
| 2023/0335643 A1 * | 10/2023 | Tsai | H01L 29/66545 |

* cited by examiner

*Primary Examiner* — Joseph C. Nicely
(74) *Attorney, Agent, or Firm* — Hauptman Ham, LLP

(57) ABSTRACT

A method of making a semiconductor device includes forming a conductive element over a substrate, depositing a layer of dielectric material over the conductive element, etching the layer of dielectric material to define an opening, where a dimension of the opening adjacent the conductive element has a first width measured in a direction parallel to a top surface of the substrate, reducing the first width by depositing a dielectric liner in the opening, etching the dielectric liner to expose a portion of the conductive element, where a dimension of the conductive element exposed has a second width less than the first width, depositing a conductive material in the opening, where the dielectric layer is between the conductive material and the layer of dielectric material, and the conductive material is electrically connected to the conductive element.

19 Claims, 15 Drawing Sheets

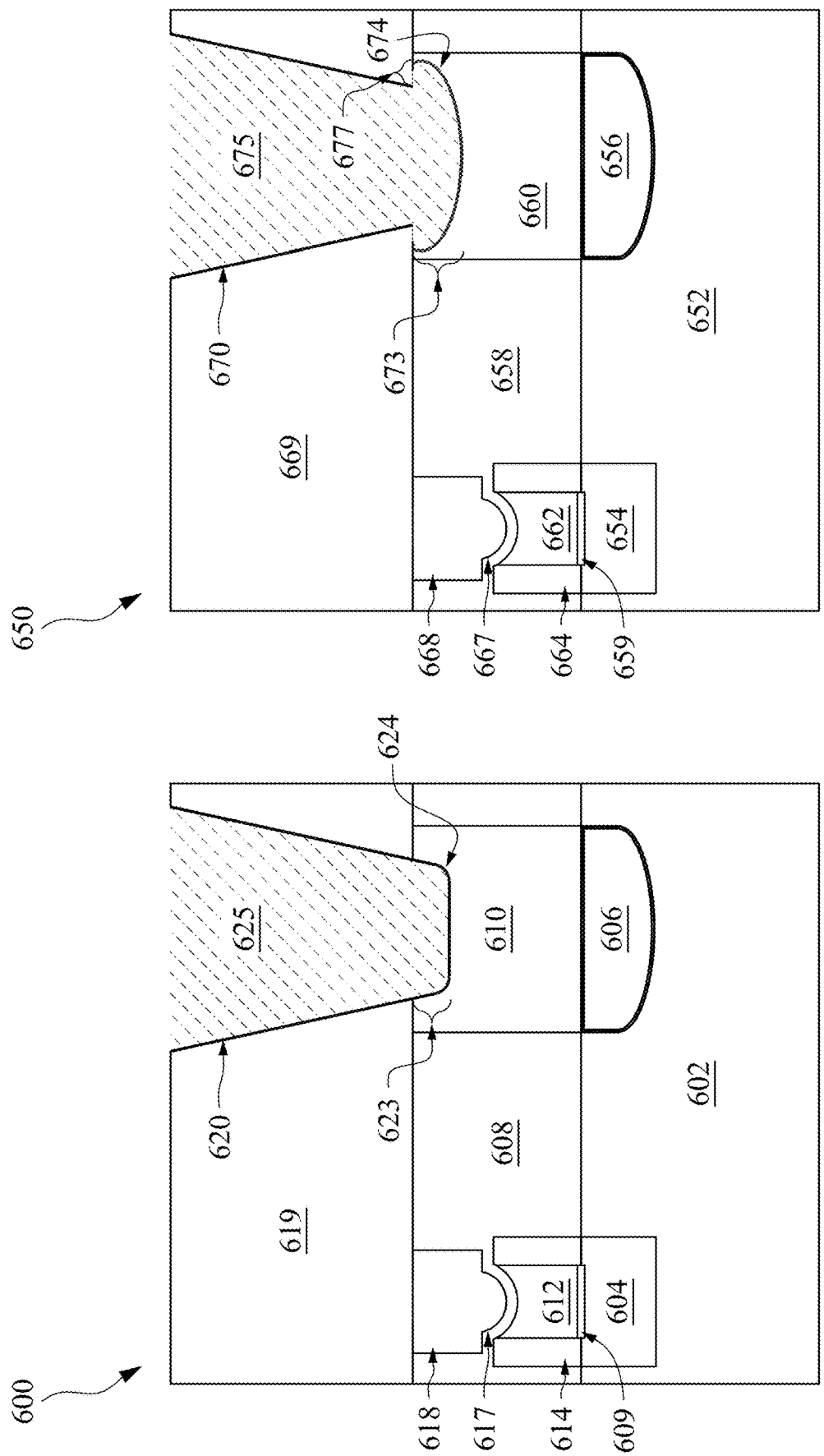

1

SEMICONDUCTOR DEVICE CONTACT AND METHOD OF MAKING SAME

This application claims priority to U.S. Provisional Patent Application No. 63/188,168 titled "NOVEL VC CD SHRINKAGE METHOD" and filed on May 13, 2021, which is incorporated herein by reference in its entirety.

BACKGROUND

Manufacturing of reliable semiconductor devices and integrated circuits is predicated on the reproducible manufacture of features and elements having different dimensions. Pattern transfer to a substrate or other layer in order to form features of a semiconductor device occurs with manufacturing processes such as photolithography, ultraviolet (UV) lithography, electron beam lithography, and helium ion beam lithography. With increasingly small features of semiconductor devices over successive generations of device designs, methods of pattern transfer have become more complex and manufacturing equipment has become more expensive.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6B are cross-sectional views of a semiconductor device in accordance with some embodiments.

DETAILED DESCRIPTION

Figure 1A:
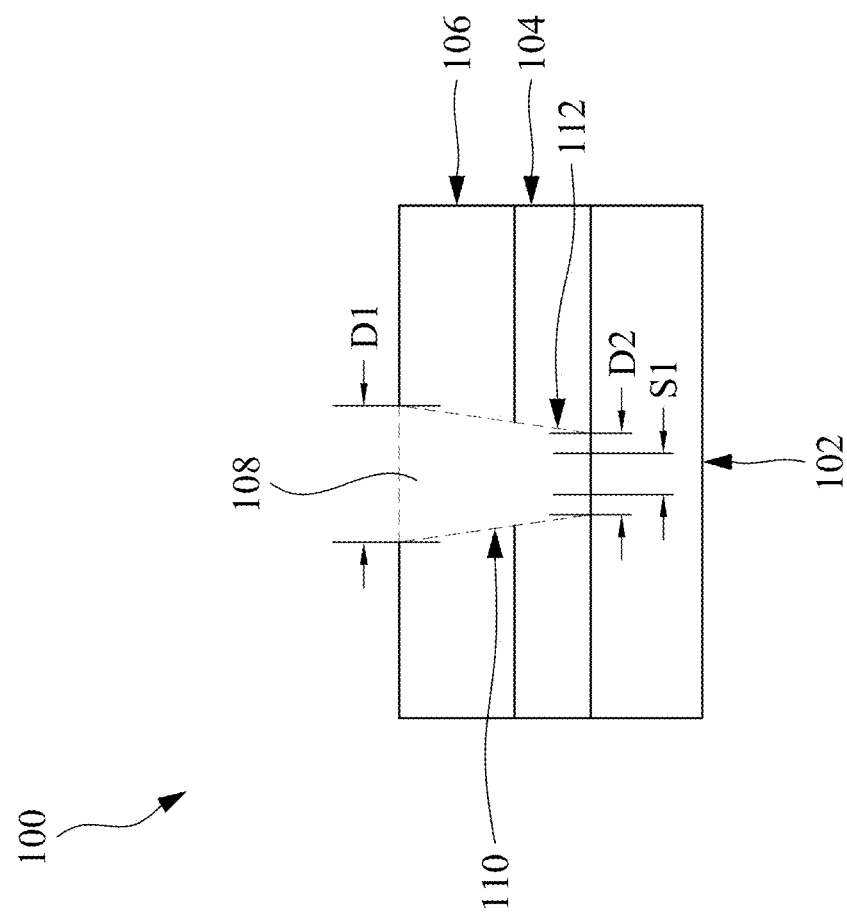
FIGS. 1A-1C are cross-sectional diagrams of a semiconductor device during a manufacturing process, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor devices become smaller, forming accurate patterns in layers of the semiconductor device becomes more difficult. The present disclosure describes a method of adding a liner layer to an opening through a dielectric material of a semiconductor device in order to reduce the difficulty of forming patterns in layers of the dielectric material for some features of the semiconductor device, especially the vias and conductive lines in the segments of an interconnect structure close to a substrate of a semiconductor device (for example, in the M0 or M1 layer(s) of the interconnect structure). The method described herein is scalable, and works for all types of openings in a layer of dielectric material, such as for contacts, conductive lines, conductive vias, dual damascene structures, as well as openings for other conductive features. The method described herein is suitable for forming contacts which electrically connect to a variety of sub-devices of a semiconductor device, including gate electrode contacts and/or source/drain electrodes for transistors, contacts to capacitors in a substrate, contacts in interposer structures, contacts for three-dimensional integrated circuit (3D IC) structures, memory devices, and other suitable devices.

Photomasks are used in photolithography processes in order to transfer a pattern to a layer of patterning material by means of light or radiation directed through the photomask onto the layer of patterning material. Increasing the process window of a pattern transfer manufacturing process reduces the complexity and difficulty of transferring patterns, e.g., by photolithography, with low levels of defectivity and increased manufacturing reliability. The present disclosure is compatible with photolithography processes, ultraviolet pattern transfer processes, helium ion patterning, and other pattern transfer manufacturing processes.

For many features of a pattern for a semiconductor device, even minor manufacturing defects have the potential to significantly disrupt the functionality of a semiconductor device. A method of the present disclosure includes identifying the size of the pattern to be transferred to the layer of the semiconductor device. Patterns having a size below a threshold value are modified to provide a wider opening in a layer of patterning material in order to increase the size of the pattern transferred to the layer of the semiconductor device. A liner layer is then deposited to produce an opening having the initially designed size for the pattern. Patterns having a size equal to or above the threshold value are formed without increasing the opening size in the pattern material and without the liner layer in order to minimize increases in complexity in the manufacturing process. In some embodiments, only a pattern having a smallest size is formed using the increased patterning material opening width and liner layer. In some embodiments, multiple patterns having a size below a threshold value are formed using the increased patterning material opening width and liner layer.

In semiconductor manufacturing, the term "critical dimension" is often abbreviated as "CD." "Critical dimension" is a term of art which refers to a dimension of a semiconductor device which has a target value according to a manufacturing specification. "Critical dimensions" of features of the semiconductor device are monitored during a manufacturing process in order to maintain performance of the semiconductor device within performance tolerances while permitting a consistent yield of the manufacturing process. In some embodiments, semiconductor device with a specific performance which falls outside the performance tolerances do not function according to the device performance specification, and are sold at a reduced price and a reduced profit to the manufacturer. In some embodiments, semiconductor device with a performance which falls outside the performance tolerances do not function at all.

On example of a "critical dimension" is the bottom dimension of a contact which electrically connects to a transistor. As dimensions of circuit elements, such as the bottom dimension of a transistor contact, shrink with advances in semiconductor device design, the dimensions become small enough to reach or exceed the functional ability of lithography tools to print patterns which are used to produce the circuit element. The present disclosure describes a method of increasing the functional process window of lithography tools to form smaller features of circuit elements than are able to be produced using lithography alone. The method disclosed herein is applicable to manufacturing processes which are capable of producing circuit element features with dimensions as small as 5 nanometers (nm). In some embodiments, the method is applicable to manufacturing processes which are capable of producing circuit elements with dimensions of approximately 2 nm. A person of ordinary skill will recognize that the method disclosed herein is applicable to pattern transfer processes including photolithography, immersion lithography, ultraviolet lithography, electron beam lithography, helium ion beam lithography, and other types of pattern transfer processes used in semiconductor device manufacturing.

FIG. 1A is a cross-sectional diagram of a semiconductor device 100, in accordance with some embodiments. Semiconductor device 100 includes a circuit element 102 with a first layer of dielectric material 104 and a second layer of dielectric material 106. A contact 108 extends through first layer of dielectric material 104 and second layer of dielectric material 106 and electrically connects to circuit element 102. In some embodiments, the circuit element includes a gate electrode for a transistor. In some embodiments, the circuit element includes a source or drain region for a transistor. In some embodiments, the circuit element includes an electrode of a capacitor. Dimension D1 corresponds to a top dimension of the contact 108 and the contact opening through dielectric material 106, distal from the circuit element 102. Dimension D2 at the bottom of contact 108 corresponds to the bottom dimension of the contact opening and the bottom dimension of the contact 108, proximal to the circuit element 102. Dimension S1 is the dimension of contact 108 in a manufacturing specification for the contact 108. S1 is smaller than D2, indicating that the combination of the dimensions of the pattern transferred to the patterning material over dielectric material 106, and the dimension of the bottom of the contact 108 after, e.g., a plasma etch process, are unable to produce the dimension S1 for the bottom of contact 108. Dielectric materials 104 and 106 have a sidewall 110 in direct contact with a sidewall 112 of the contact 108. In some embodiments, the contact 108 includes a liner layer in addition to a conductive material of the contact 108. The liner layer helps to reduce or prevent migration of conductive material of the contact 108 into the surrounding first layer of dielectric material 104 and second layer of dielectric material 106.

In FIG. 1A, dimension S1 is a specification dimension for the bottom of contact 108, proximal to circuit element 102. Dimension S1 is a non-limiting example of a dimension which is monitored during a manufacturing process to maintain the performance of semiconductor devices within performance specifications. For example, semiconductor devices having a bottom dimension of a contact not equal to the specification dimension, outside of a manufacturing tolerance for the specification dimension, the performance of the semiconductor device falls outside of a performance specification, or the semiconductor device may not function at all.

Figure 1B:
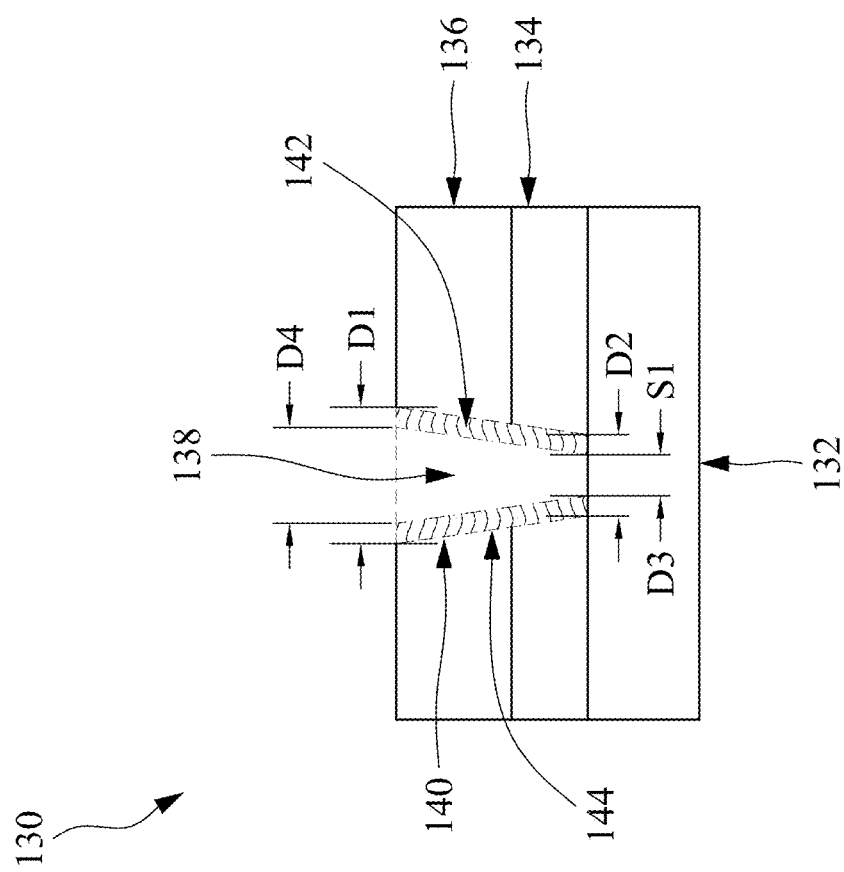

FIG. 1B is a cross-sectional diagram of a semiconductor device 130, in accordance with some embodiments. Elements of semiconductor device 130 which have a similar structure and function as elements of semiconductor device 100 in the description of FIG. 1A have a same identifying numeral, incremented by 30. Semiconductor device 130 corresponds to a semiconductor device which is manufactured according to method 200, as described below, where operations 212 and 216 have been omitted from the manufacturing process. In semiconductor device 130, a dimension offset liner material (DOLM) 142 has been deposited on the sidewall 140 of dielectric materials 134 and 136, and separates the sidewall 144 of contact 138 from sidewall 140 of dielectric materials 134 and 136. In some embodiments, DOLM 142 includes a dielectric material. In some embodiments, DOLM 142 includes a layer of oxide. In some embodiments, DOLM 142 includes a layer of nitride. In some embodiments, DOLM 142 includes silicon dioxide. In some embodiments, DOLM 142 includes silicon nitride. In some embodiments, the DOLM 142 is deposited by chemical vapor deposition (CVD). In some embodiments, the DOLM 142 is deposited by plasma enhanced chemical vapor deposition (PECVD). In some embodiments, DOLM 142 is deposited by atomic layer deposition (ALD). In some embodiments, a layer of DOLM 142 is deposited by plasma enhanced atomic layer deposition (PEALD). In some embodiments, DOLM 142 is deposited in direct contact with the dielectric materials 134 and 136 through which the contact extends. In some embodiments, a diffusion barrier layer separates the DOLM 142 from the layers of dielectric materials through which the contact extends.

DOLM 142 partially fills the contact opening in dielectric materials 134 and 136 to produce a reduced, or narrowed contact opening, which has a bottom dimension D3 which is substantially equal to the dimension S1. Thus, the use of a DOLM extends the manufacturing process window for making the contact to extend the usefulness of a lithography tool in a manufacturing facility where the combination of patterning and etching without using a DOLM does not otherwise achieve the dimension S1 for a contact.

DOLM 142 has approximately the same thickness along the entirety of the sidewall 140 between layers of dielectric material 134 and 136, and the sidewall 144 of contact 138. In other words, the thickness of the upper portion of the DOLM 142 at an end of sidewall 140 distal from circuit element 132 is approximately (e.g., within 100%±20%) of the thickness of the DOLM 142 at an end of sidewall 140 proximal to circuit element 132. As the difference in thickness of the DOLM at the bottom of the contact opening increases, with respect to the thickness at the top of the contact opening, the contact resistance of the contact increases and the contact becomes more prone to voids or other manufacturing defects.

In semiconductor device 130, a dimension D3 of the bottom of the contact opening, or the dimension between the DOLM 142 at one side of the contact opening, and the DOLM 142 at the other side of the contact opening. In semiconductor device 130, dimension D3 is equal to dimension S1. The thickness of the DOLM 142 is half of the difference between D2 and D3: e.g., $(0.5) \times (D2-D3)=$ DOLM 142 thickness.

Figure 1C:
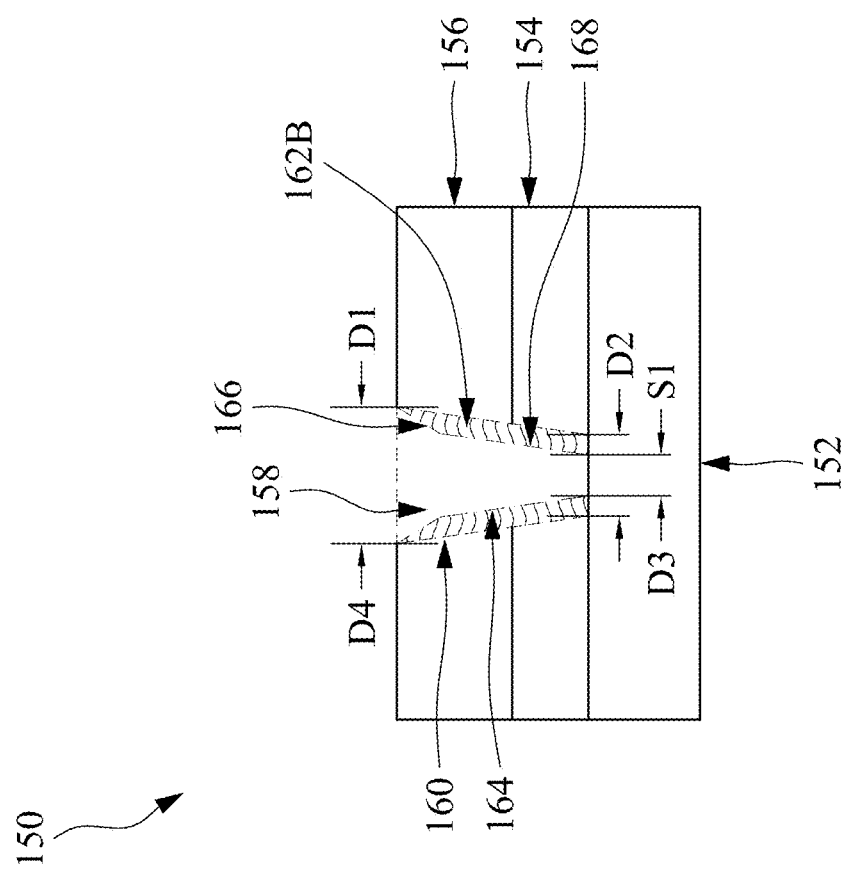

FIG. 1C is a cross-sectional diagram of a semiconductor device 150, in accordance with some embodiments. In FIG. 1C, elements of semiconductor device 150 which have a similar structure and/or function as an element of semiconductor device 130 of FIG. 1B have a same identifying numeral, incremented by 20. Semiconductor device 150 corresponds to a semiconductor device which is produced by method 200, including operation 212 as described below, where the upper portion of the dimension offset liner material is trimmed to be thinner than the lower portion of the dimension offset liner material, and excluding operation 216, wherein an exposed portion of a circuit element (e.g., circuit element 152) is etched.

In FIG. 1C, dimension D1 corresponds to the dimension of the top opening in dielectric material 156, and dimension D4 corresponds to the dimension of the top of contact 158. In semiconductor device 150, dimension D1 is substantially equal to dimension D4. In some embodiments, dimension D1=dimension D4, and the DOLM 162B has been trimmed sufficiently to expose a sidewall of dielectric material 156 on one or both sides of the contact opening above the top of DOLM 162B.

In FIG. 1C, the DOLM 162B has a lower portion, where the thickness remains approximately constant. DOLM 162B has an upper portion where the thickness decreases with increasing distance from the circuit element 152. Thus, the lower sidewall 168 of DOLM 162B has a first slope, which is approximately constant along the lower sidewall, and an upper sidewall 166, where the slope is different than the slope of the lower sidewall 168.

In semiconductor device 150, contact 158 has a dimension D4 between the upper sidewall 168 at opposite sides of the contact 158.

Figure 2:
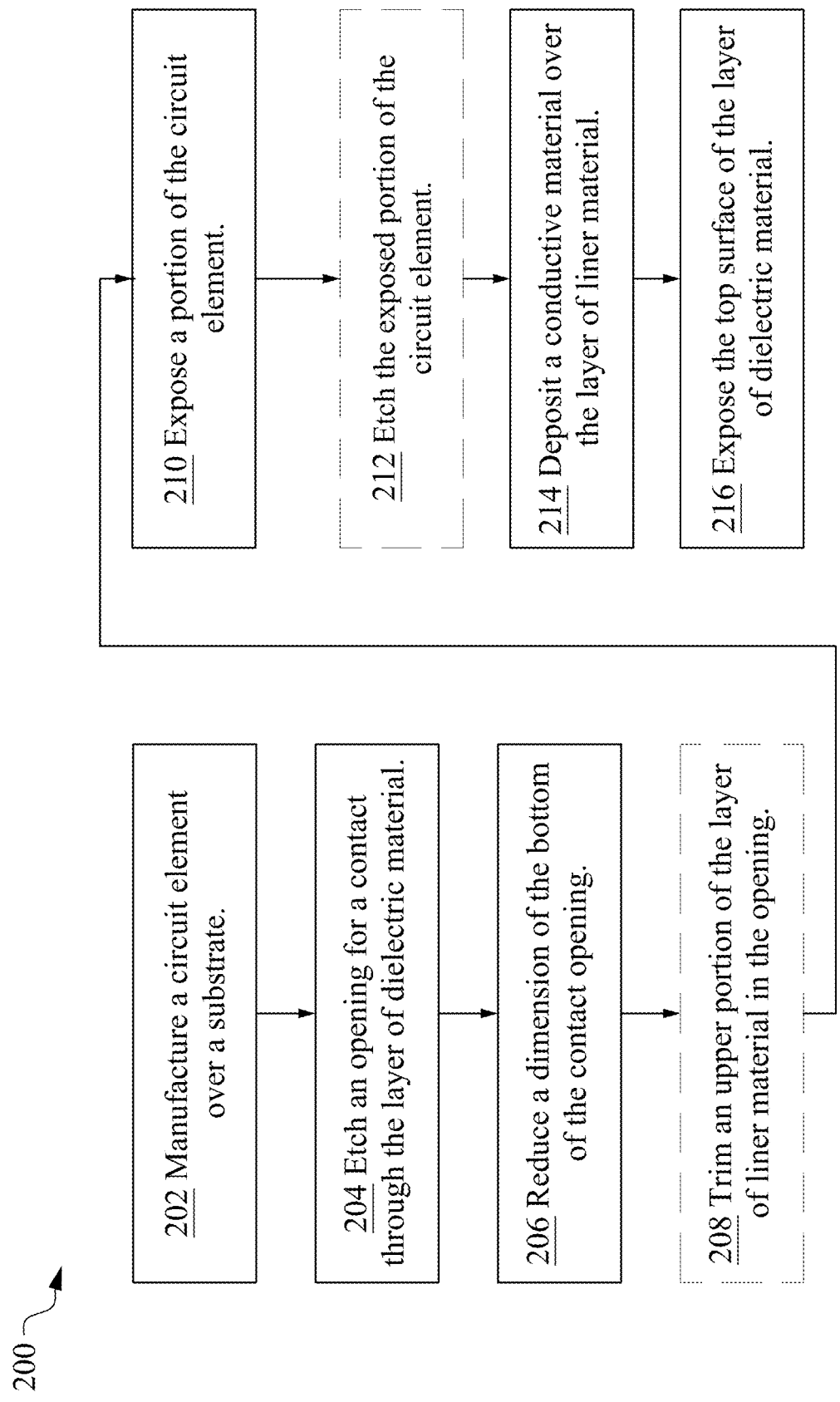
FIG. 2 is a flow diagram of a making a semiconductor device, in accordance with some embodiments.

FIG. 2 is a flow diagram of a method 200 of manufacturing a semiconductor device, in accordance with some embodiments of the present disclosure. For purposes of clarity, the circuit element described in method 200 is a FinFET transistor. The method disclosed herein is compatible with methods of manufacturing contacts or interconnects at multiple positions in an interconnect structure, including, e.g., the V0 layer of the interconnect structure which electrically connects to transistors or other circuit elements in a semiconductor device. The method disclosed herein is compatible with interconnect structures on the front side and the back side of a semiconductor device, according to some embodiments.

A summary of the operations included in method 200 is provided below. A detailed description of each operation of method 200 is provided following the method summary. Method 200 includes the following operations: operation 202, forming a circuit element, e.g., a transistor, over a substrate; operation 204, forming an opening extending through the layer of dielectric material; operation 206, reducing a bottom dimension of the opening; optional operation 208, trimming an upper portion of the DOLM; operation 210, exposing the a portion of the circuit element; optional operation 212, etching the exposed portion of the circuit element; operation 214, depositing a conductive material in the opening; and operation 216, exposing a top surface of the dielectric material.

Method 200 includes an operation 202, wherein a circuit element is manufactured over a substrate. To present the subject matter of the present disclosure, the circuit element described below is a FinFET transistor for a semiconductor device. According to some embodiments, the circuit element is a planar transistor. In some embodiments, the circuit element is a gate-all-around (GAA) transistor. In some embodiments, the circuit element includes a passive device, such as a capacitor or a resistor. A person of ordinary skill will recognize that the scope of the present disclosure extends to methods of manufacturing circuit elements other than transistors, including memory structures, and so forth.

In some embodiments, the substrate comprises undoped silicon. In some embodiments, the substrate is an N-doped silicon substrate. In some embodiments, the substrate is a P-doped silicon substrate. In some embodiments, the substrate comprises silicon-germanium (SiGe), gallium-arsenide (GaAs), or other substrates suitable for manufacturing semiconductor devices. In some embodiments, the substrate is a silicon-on-insulator (SOI) substrate.

Operation 202 includes steps related to associated with the manufacture of a FinFET transistor including steps for forming active areas in the of semiconductor material of the substrate. Forming active areas of semiconductor material includes steps for depositing a layer of patterning material over the semiconductor material of the substrate, steps for transferring a pattern to the layer of patterning material, wherein a pattern corresponds locations of active areas and fins of the transistors of the semiconductor device, and steps for etching the semiconductor material. Etching the semiconductor material forms recesses around the active areas of the semiconductor device, and forms recesses between fins of semiconductor material.

Operation 202 includes steps associated with depositing a layer of dielectric material (STI dielectric material) in the shallow trench isolation (STI) structure or recess formed around the active areas of the semiconductor device and in between fins of the semiconductor device within the active areas. Recesses between fins of semiconductor material and around the active areas of the semiconductor device are filled with a dielectric material to promote electrical isolation of fins from one active area from fins of the same active area, or another active area of the semiconductor device (see below). According to some embodiments, the STI dielectric material deposited between the fins and in the recesses around active areas comprises silicon dioxide (SiO2), a low-k material, or other dielectric materials for STI structures. In some embodiments, depositing a layer of dielectric material comprises filling the recesses formed around the active areas completely, and filling the gaps between fins of semiconductor material completely, and covering the fins of semiconductor material.

Operation 202 includes steps associated with manufacturing transistor fins. For purposes of clarity, the process of forming an active area described above comprises etching tall fin-shaped structures in a substrate comprising semiconductor material, and the process of "manufacturing transistor fins" described herein comprises "exposing upper portions of the tall fin-shaped structures etched in the substrate" by recessing the STI dielectric material between and around fins of the active areas, in preparation for subsequent steps for manufacturing a transistor.

In some embodiments, recessing the STI dielectric material to expose an upper portion of the fins of semiconductor material is performed by a plasma etch process. In some embodiments, recessing the dielectric material to expose an upper portion of the fins of semiconductor material comprises a wet etch or liquid etch processing using, for example, dilute hydrofluoric acid. In some embodiments, dilute hydrofluoric acid removes dielectric material and has a very low rate of removal of semiconductor materials.

Operation 202 includes steps associated with forming dummy lines of the semiconductor device. For example, forming dummy lines, also called dummy poly lines, of a semiconductor material includes steps associated with depositing a layer of patterning material over the substrate, including open areas of substrate material. Forming dummy lines includes steps associated with transferring the pattern to the layer of patterning material such that lines of patterning material correspond with positions of dummy lines in the open areas of the substrate. Forming dummy lines also includes steps associated with pattern transfer to a top surface of the semiconductor material, etching the semiconductor material, and a cleaning process after pattern transfer and etching steps.

Operation 202 includes steps associated with manufacturing spacers in contact with sides of the dummy poly lines. In some embodiments, steps associated with manufacturing spacers include depositing a conformal dielectric material over the sides and top surfaces of the dummy poly lines, and over the top surface of dielectric material between dummy poly lines, and over the top surface of STI dielectric material extending around the active areas of the circuit elements. In some embodiments, the dielectric material is deposited by chemical vapor deposition (CVD). In some embodiments, the dielectric material is deposited by plasma enhanced CVD (PECVD). In some embodiments, the dielectric material is deposited by atomic layer deposition (ALD). In some embodiments, the dielectric material is deposited by plasma enhanced atomic layer deposition (PEALD). In some embodiments, the dielectric material comprises silicon nitride. In some embodiments, the dielectric material comprises silicon oxy-nitride. In some embodiments, the dielectric material comprises silicon carbide, or some other dielectric material compatible with spacers for a gate structure.

Operation 202 includes steps associated with adding dopants into the source and drain regions of a transistor. In a non-limiting example, a hardmask is deposited over the spacer, the fins of semiconductor material, and the STI region extending around the active areas. Hardmasks are usable to protect portions of the semiconductor device from receiving dopant atoms during a doping process. As described below, dopants are added to the source/drain regions by the doping process. The poly hardmask is manufactured into a patterned layer by the procedure described below. In some embodiments, a layer of patterning material is deposited over the hardmask, and a pattern is transferred thereto such that openings in the pattern, once developed, extend through the layer of patterning material and expose source/drain regions of the transistor fins. In the non-limiting example, dopants are added to the source/drain regions of the transistor by performing an etching process on the source/drain regions of the transistor fins followed by an epitaxial deposition of dopant material, such that the dopant material is in direct contact with the source/drain regions of the transistor, and the hardmask protects other portions of the transistor, or the semiconductor device, from the dopant atoms being added to the source/drain regions of the transistor. According to some embodiments, the dopant added for N-type epitaxial doping processes includes arsenic (As). In some embodiments, the dopant added for P-type epitaxial doping processes includes boron (B). In the non-limiting example, an anneal process is performed to add dopants to the source/drain regions.

Operation 202 includes steps related to depositing a layer of contact etch stop material (CESL) over the source/drain regions and over the poly hardmask over the gate electrode of the transistor. Operation 202 further include steps related to depositing a first inter-layer dielectric (ILD) material over the CESL and a chemical mechanical polishing (CMP) process is performed in order to expose a top surface of the poly hardmask. In some embodiments, the CESL comprises a silicon nitride layer. In some embodiments, the CESL comprises a silicon oxy-nitride layer. In some embodiments, the CESL is deposited by an ALD process. In some embodiments, the CESL is deposited by a PEALD process. In some embodiments, the CESL is deposited by a CVD process, or some other process suitable for manufacturing thin conformal films of dielectric material. In some embodiments, the first ILD material comprises silicon dioxide or some other suitable dielectric material for, e.g., a V0 level in a semiconductor device interconnect structure. According to some embodiments, the first ILD comprises silicon dioxide. In some embodiments, the first ILD comprises boron-phosphorous silicate glass (BPSG), spin on glass (SOG), or another dielectric material compatible with deposition over transistors. In some embodiments, the first ILD comprises a layer of low-k dielectric material with a dielectric constant less than the dielectric constant of silicon dioxide (e.g., <about 3.7 to 3.9). In some embodiments, the first ILD comprises a porous dielectric material, a carbon-containing dielectric material, or another low-k dielectric material compatible with deposition over FinFET-type transistors.

In some embodiments, a chemical mechanical polishing (CMP) process is performed to expose a top surface of the poly hardmask in the region of the transistor channel, and the CESL in the region of the source/drain regions of the transistor.

Operation 202 includes steps related to manufacturing a gate electrode, which include performing a first etch process to expose the dummy poly lines. Steps related to manufacturing a gate electrode also include steps related to removing the semiconductor material of the dummy poly lines and depositing a gate dielectric material over the channel region of the fins, and steps related to depositing a gate electrode material over the channel region of the fins. In some embodiments, a liner material is also deposited in proximity to the gate dielectric material to reduce short circuits between the gate electrode material and the channel region. In some embodiments, the gate electrode material is a conductive material. In some embodiments, the conductive material is a metal. In some embodiments, the metal comprises cobalt (Co), tungsten (W), ruthenium (Ru), molybdenum (Mo), nickel (Ni), and/or alloys thereof, as well as other conductive materials compatible with deposition over the gate dielectric material in contact with the semiconductor material of the fins.

Method 200 includes an operation 204 wherein an etch process is performed to expose a portion of the transistor. In some embodiments, the etch process includes a wet etch process or a dry etch process. In some embodiments, the exposed portion is a transistor gate electrode. In some embodiments, the exposed portion is a source\drain region.

For purposes of the present disclosure, a source\drain region manufactured as part of operation 202 is referred to for clarity. The etch process defines an opening through the layer of dielectric material. In some embodiments, the opening has substantially parallel sidewalls. In some embodiments, the opening has tapered sidewalls.

Method 200 includes an operation 206 wherein a bottom dimension of the opening extending through the layer of dielectric material is reduced. Reducing the bottom dimension of the opening extending through the layer of dielectric material is accomplished by depositing a layer of DOLM over the layer of dielectric material and in the opening extending through the layer of dielectric material.

According to some embodiments, the DOLM comprises a dielectric material deposited by an atomic layer deposition (ALD), a plasma-enhanced atomic-layer deposition (PEALD) process or another suitable deposition process. According to some embodiments, the DOLM comprises silicon nitride (SiN), silicon carbide (SiC), silicon oxycarbide (SiOC), silicon carbon-nitride (SiCN), or another suitable dielectric material.

According to some embodiments, the DOLM is deposited with a liner thickness of between 0.5 nanometers (nm) and 10 nm. In some embodiments, the DOLM thickness is between 0.5 nm and 5 nm. If the thickness of the DOLM is too small the DOLM is prone to uneven coverage making the actual reduction of the contact opening unpredictable, in some instances. If the thickness of the DOLM is too large, the contact has increased contact resistance because the bottom dimension of the contact is small with respect to other contacts in the interconnect structure, in some instances.

According to some embodiments, the dimension offset liner material is deposited every contact opening across a wafer in order to provide uniform adjustment of contact diameters across an entirety of the wafer containing semiconductor devices. According to some embodiments, the dimension offset liner material is deposited only in selected contact openings in order to meet design specifications for contact openings having a bottom dimension below a certain threshold. In some embodiments, a center-thick, edge-thin deposition process for the DOLM is suitable for correcting and compensating for etch processes in a manufacturing processes which are faster at the center of a wafer than at the edge of the wafer. Conversely, a center-thin, edge-thick deposition process for the DOLM is suitable for correcting and compensating for etch processes in a manufacturing processes which are slower at the center of a wafer than at the edge of the wafer. Thus, in some embodiments, the DOLM deposition is applied to compensate for variations in an etch processes which has a non-uniform profile between a center and the edge of a wafer, increasing the process yield.

In some embodiments, method 200 includes an optional operation 208 wherein an etch process is performed to trim an upper portion of the DOLM in the opening. In some embodiments, the etch process is a plasma etch process with chemistry tuned to selectively remove the material of the DOLM. In a non-limiting embodiment of the present disclosure, a plasma etch process which trims the upper portion of the DOLM is produced by tuning a plasma etch reaction chamber to have a large gas ionization setting and a small ion acceleration setting. By reducing the ion acceleration energy, plasma produced by the plasma etch reaction chamber interacts primarily with the upper portion of the DOLM, while the lower portion of the DOLM, and the portion of the DOLM extending across the surface of the circuit element do not undergo significant etching.

Method 200 includes an operation 210 wherein an etch process is performed to remove a portion of the DOLM in direct contact with the transistor. The etch process performed during operation 210 also removes a portion of the DOLM over a top surface of the dielectric material, e.g., the second layer of dielectric material 136 (FIG. 1B).

In some embodiments, the etch process comprises a plasma etch to remove the dimension offset liner material from the top surface of the dielectric material and the top surface of the transistor below the opening while leaving the DOLM on the sidewalls of the contact opening. The power and chemistry of the DOLM removal etch is adjustable according to the material and thickness of the DOLM. In some embodiments of method 200, optional operation 208 is combined with operation 210, such that the plasma etch conditions of operation 208 are rapidly changed to the plasma etch conditions of operation 210 without halting the plasma etch process. By performing operations 208 and 210 in a single etch process, with two sets of plasma etch conditions, a number of cleaning steps for the manufacturing process is reduced and the Method 200 includes an optional operation 212 wherein an exposed portion of the transistor is etched through the contact opening lined with the DOLM.

In optional operation 212, an etch process is performed on the exposed portion of the transistor (e.g., a conductive portion of the transistor, the gate electrode or an ESD electrode) in order to increase a contact area between a conductive material of a contact and the transistor to reduce resistance between exposed portion of the transistor and the contact being manufactured.

In some embodiments, an isotropic etch is performed, e.g., using a wet etch or liquid etch process, in order to extend the contact opening into the exposed portion of the transistor. In some embodiments, the isotropic etch undercuts the DOLM proximal to the exposed portion of the transistor. In some embodiments, the isotropic etch undercuts a portion of the dielectric material proximal to the exposed portion of the transistor.

In some embodiments, an anisotropic etch is performed using a plasma etch process in order to extend the contact opening into the exposed portion of the transistor. Contact openings extended into the exposed portion of the transistor by a plasma etch process with high anisotropy have little or no undercut of the DOLM proximal to the exposed portion of the transistor (e.g., the gate electrode or ESD electrode).

The chemistry of an etch process used to extend the contact opening into the exposed portion of the transistor are determined according to the material being etched and the selectivity indicated by a manufacturing specification in order to preserve dimensions of the dimension offset liner material on a sidewall of the opening through the layer of dielectric material over the transistor.

In some embodiments, optional operation 212 is performed when, for a semiconductor device, the contact resistance is empirically determined to be too large in comparison to a semiconductor device specification. In some embodiments, the optional operation 212 is omitted upon determining that the contact resistance for a semiconductor device is within a semiconductor device specification. Performing optional operation 212 increases the risk of performance-impacting defects occurring during a manufacturing process. By omitting optional operation 212, the risk of performance-impacting defects occurring in a manufacturing process are reduced.

Method 200 includes an operation 214, wherein a conductive material is deposited in the contact opening over the DOLM. The conductive material is deposited over the DOLM to fill a remaining portion of the contact opening. In some embodiments, the conductive material comprises a metal, such as cobalt (Co), tungsten (W), ruthenium (Ru), molybdenum (Mo), nickel (Ni), platinum (Pt), palladium (Pd), and the like. In some embodiments, a seed layer or liner layer is also deposited into the contact opening prior to deposition of the conductive material Method 200 includes an operation 216 wherein a CMP process is performed to expose the top surface of the dielectric material and an end of the DOLM distal from the transistor. By planarizing the semiconductor device to expose the top surface of the dielectric material, a manufacturing process provides for uniform dimensions of contacts and conductive lines in an interconnect structure over the transistor and increases the uniformity of resistance across the semiconductor device.

In the method presented in the present disclosure, a manufacturing process which produces openings in layers of patterning material and in layers of dielectric material which are larger than design specifications are compensated for by depositing a layer of DOLM (see DOLM 326 of FIG. 3 below) in order to reduce the dimensions of an overly-large opening through a layer of dielectric material to the dimensions prescribed in a semiconductor device manufacturing specification.

FIGS. 3A-3D are cross-sectional views of a semiconductor device 300 during a manufacturing process, in accordance with some embodiments. The following description uses a transistor as an example of the semiconductor device 300. However, one of ordinary skill in the art would recognize that the current disclosure is not limited to a transistor.

Figure 3A:
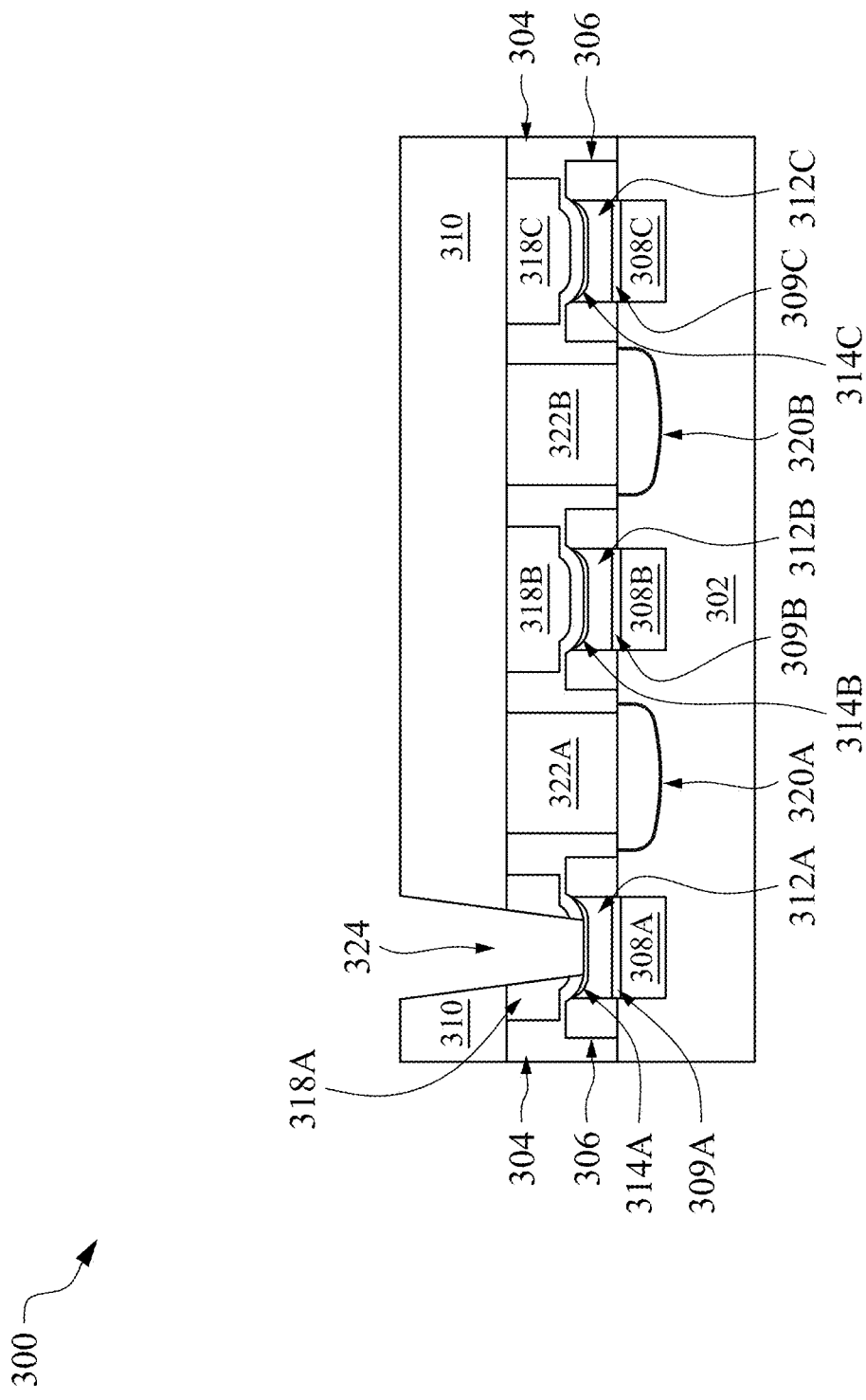
FIGS. 3A-3D are cross-sectional views of a semiconductor device during a manufacturing process, in accordance with some embodiments.

In FIG. 3A, a semiconductor material 302 includes a plurality of channel regions 308A, 308B, and 308C. In FIG. 3A, the layer of patterning material which was used to manufacture the contact opening 324 has been removed for clarity. An SD region 320A is located in between channel region 308A and channel region 308B; SD region 320B is located between channel region 308B and channel region 308C. SD electrode 322A is in electrical contact with SD region 320A; SD electrode 322B is in electrical contact with SD region 320B. A first layer of dielectric material 304 extends over a top surface of semiconductor material 302. SD electrode 322A extends through first layer of dielectric material 304 to electrically connect with SD region 320A. SD electrode 322B extends through first layer of dielectric material 304 to electrically connect with SD region 320B.

Gate electrode 312A is over channel region 308A. A gate dielectric material 309A is between gate electrode 312A and channel region 308A. Gate electrode 312B is over channel region 308B. Gate dielectric material 309B is between gate electrode 312B and channel region 308B. Gate electrode 312C is over channel region 308C. Gate dielectric material 309C is between gate electrode 312C and channel region 308C.

Spacers 306 extend along the sides of the gate electrodes 312A, 312B, and 312C. In some embodiments, spacers 306 are in direct contact with semiconductor material 302. Contact etch stop layers (CESLs) 314A-314C extend over a top surface of spacers 306 and corresponding gate electrodes 312A-312C.

Self-aligned contact 318A is over the CESL 314A and gate electrode 312A. Self-aligned contact 318B is over contact etch stop layer 314B and gate electrode 312B. Self-aligned contact 318C is over the contact etch stop layer 314C and gate electrode 312C.

First layer of dielectric material 304 is in contact with semiconductor material 302 and spacers 306. First layer of dielectric material 304 separates the self-aligned contacts 318A and 318B from SD electrode 322A. First layer of dielectric material 304 also separates self-aligned contacts 318B and 318C from SD electrode 322B.

A second layer of dielectric material 310 extends over a top surface of first layer of dielectric material 304, a top surface of self-aligned contacts 318A, 318B, and 318C, and SD electrodes 322A and 322B.

A contact opening 324 extends through an entirety of second layer of dielectric material 310, self-aligned contact 318A, and CESL 314A. A top surface of gate electrode 312A is exposed by the contact opening 324. In some embodiments, FIG. 3A is a view of a semiconductor device following operation 204 of the method 200 (FIG. 2).

Figure 3B:
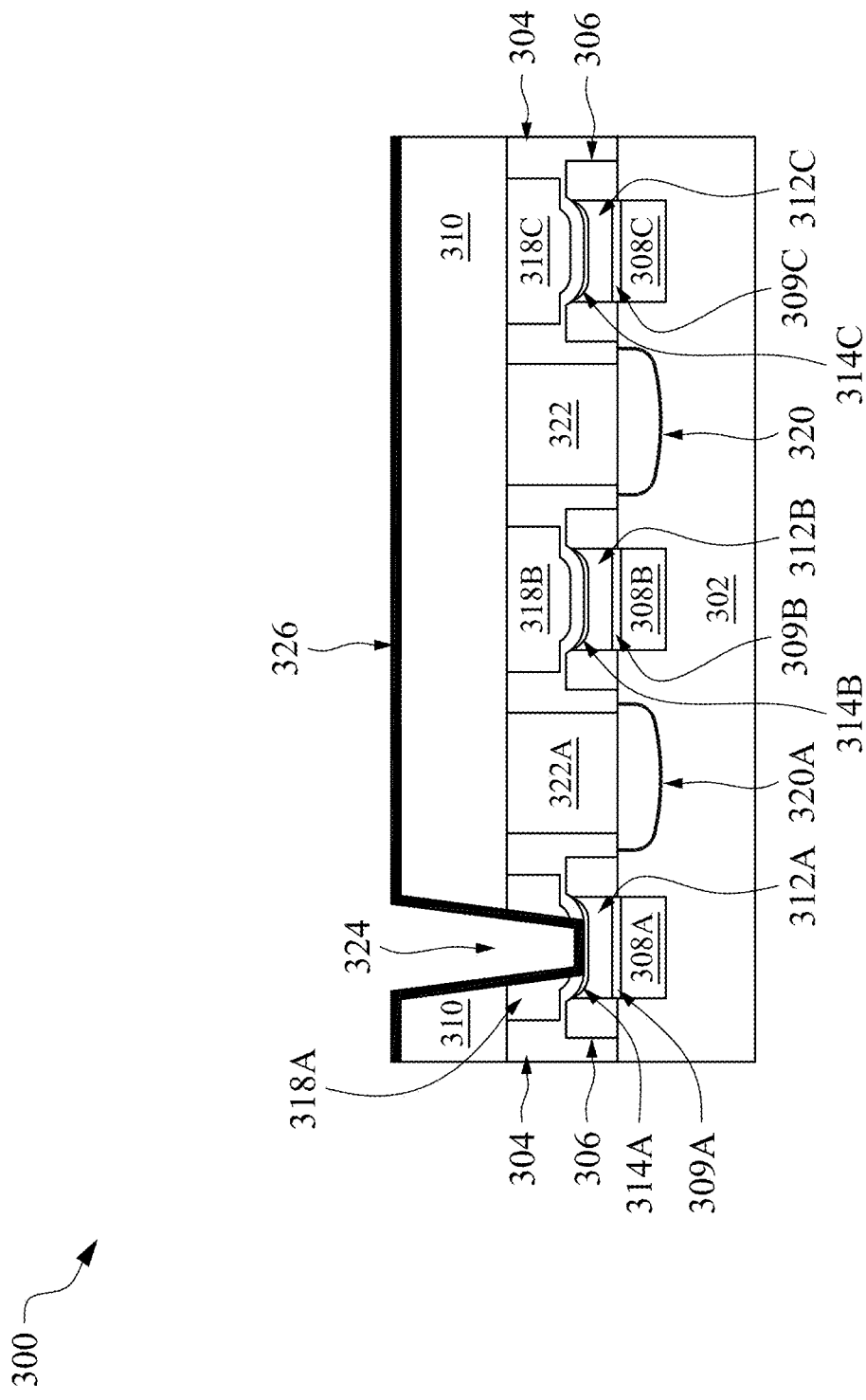

In FIG. 3B, a DOLM 326 is deposited over a top surface of second layer of dielectric material 310, the sidewalls of contact opening 324, and the top surface of gate electrode 312A at the bottom of contact opening 324. The DOLM 326 includes similar materials and dimensions as those described above with respect to DOLM 142 (FIG. 1B). In some embodiments, FIG. 3B is a view of a semiconductor device following operation 206 of the method 200 (FIG. 2).

The DOLM, or dimension offset liner material, is a material deposited along the inner sidewalls of the opening. The sidewalls of the opening are offset toward the middle of the opening by the DOLM, reducing the size of the opening. By reducing the size of the opening by depositing the DOLM in the opening, the method described herein mimics, to some degree, the result of a more advanced lithography process, e.g., a smaller opening dimension.

Figure 3C:
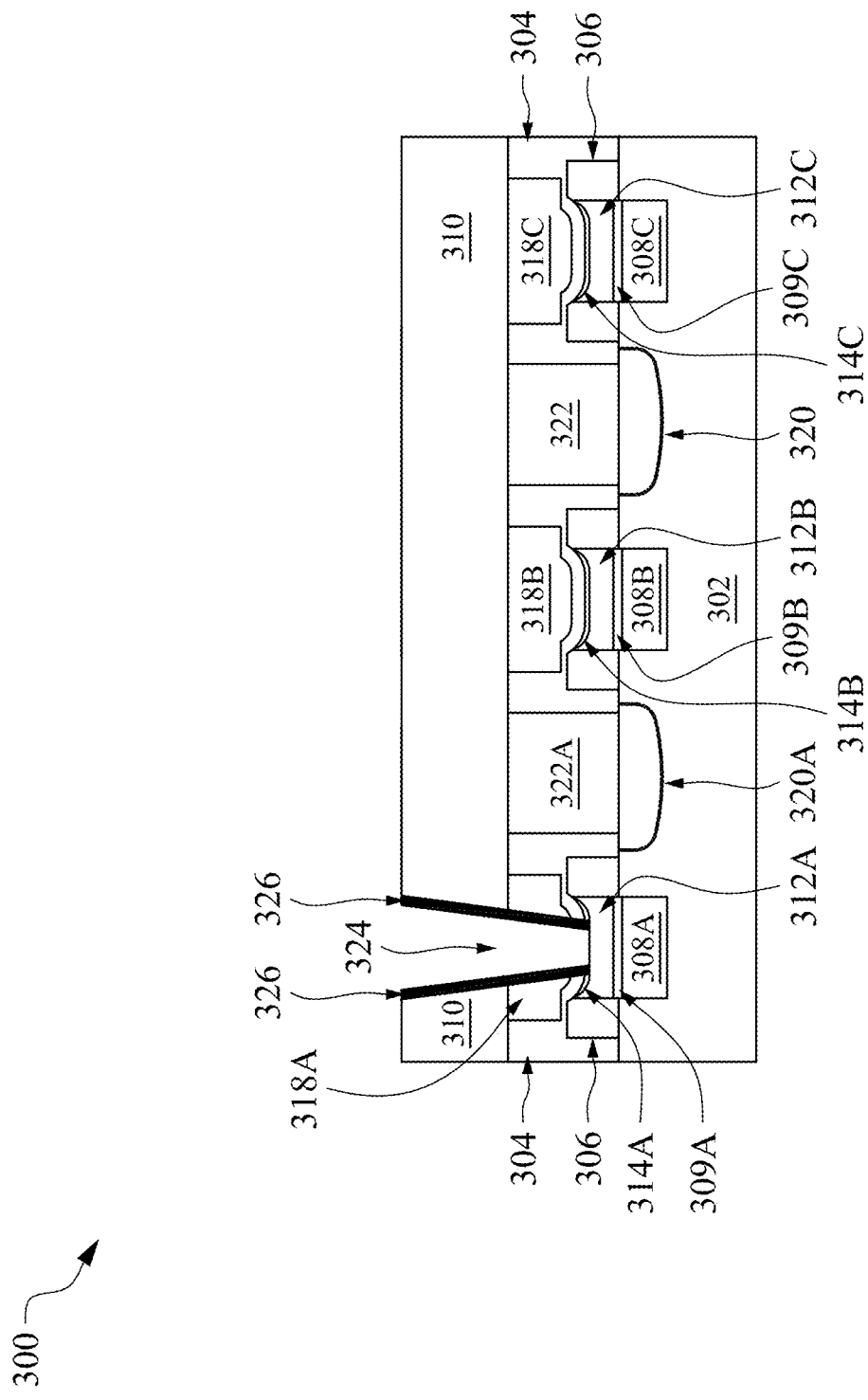

In FIG. 3C, an etch process has been performed to remove the DOLM 326 from the top surface of second layer of dielectric material 310 and the top surface of gate electrode 312A exposed through the contact opening 324. For example, see operation 210 of method 200, described above, for a description of etch processes to remove the DOLM from the top surface of the gate electrode. In some embodiments, the etch process comprises generating a plasma containing fluorine atoms and/or fluorine ions which react with the dimension offset liner material. In some embodiments, the etch process is performed with a low acceleration velocity into the DOLM 326 remains on the sidewalls of contact opening 324. In some embodiments, FIG. 3C is a view of a semiconductor device following operation 210 of the method 200 (FIG. 2).

Figure 3D:
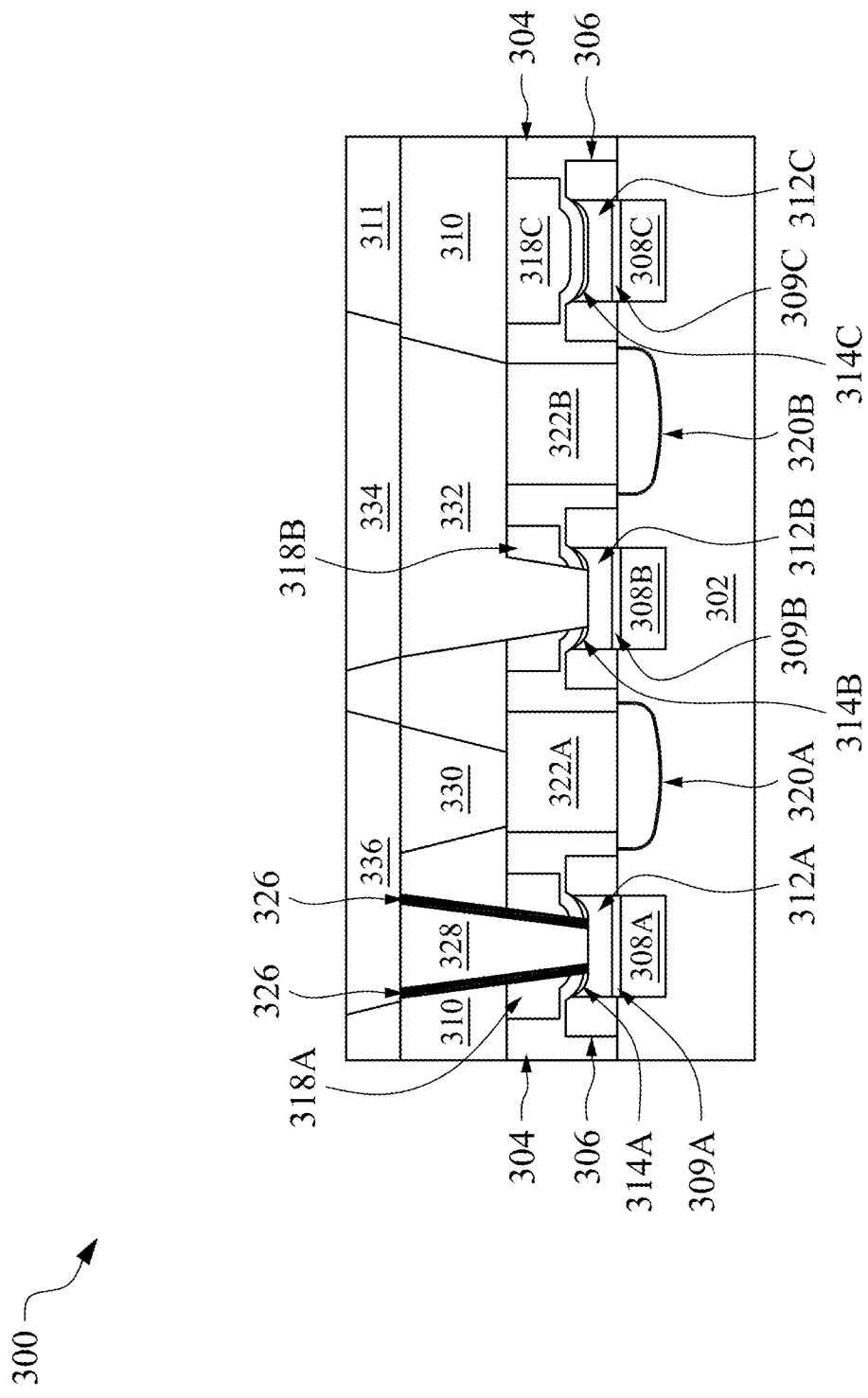

In FIG. 3D, contact 328 electrically connects gate electrode 312A to conductive line 336, and contact 330 electrically connects SD electrode 322A to conductive line 336. DOLM 326 separates contact 328 from second layer of dielectric material 310, self-aligned contact 318A, and first layer of dielectric material 304. Contact 332 electrically connects gate electrode 312B and SD electrode 322B to conductive line 334. Contact 330 and contact 332 do not have a DOLM because a dimension of the interface between the contact 330 and SD electrode 322A, and a dimension of the interface between contact 332 and each of the gate electrode 312B and the S/D electrode 322B, is sufficiently large to reliably manufacture without a DOLM. In some embodiments, FIG. 3D is a view of a semiconductor device following operation 216 of the method 200 (FIG. 2).

In FIG. 3D, the contact opening (see contact opening 324 of FIG. 3C) and the DOLM 326 are manufactured as described above in the discussion of FIGS. 3A-3C. No conductive material is deposited into the contact opening. In a non-limiting example of a manufacturing process, operations to produce semiconductor device 300, as shown in FIG. 3D, include the following operations: A first layer of patterning material (not shown) is deposited over a top surface of dielectric material 310 and over a top surface of DOLM 326, and filling the contact opening 324. A first pattern is transferred to the first layer of patterning material, with openings therein at the locations of contacts 330 and 332, as described in FIG. 3D, and exposing the top surface of dielectric material 310 at the bottom of the openings in the first layer of patterning material. A first etch process is performed wherein openings in the dielectric material 310 are formed, exposing a top surface of SD electrode 322A and SD electrode 322B.

The first layer of patterning material is removed from the top surface of dielectric material 310, and from within contact opening 324 over DOLM 326, and a second layer of patterning material (not shown) is deposited over the top surface of dielectric material 310, over DOLM 326, and in contact openings for contacts 330 and 332. A second pattern is transferred to the second layer of patterning material, wherein an opening is formed in the second layer of patterning material directly over gate electrode 312B. A second etch process is performed to expose a top surface of gate electrode 312B, and the second layer of patterning material is removed.

A conductive material deposition process is performed to add conductive material, e.g., contact metals as described hereinbelow, such as cobalt, titanium, tungsten, platinum, palladium, nickel, and ruthenium. In some embodiments, liner materials are deposited in the contact openings before the conductive material is deposited. In some embodiments, barrier materials are deposited in the contact openings before the conductive material is deposited. In some embodiments, the conductive materials are deposited by sputtering processes. In some embodiments, the conductive materials are deposited by electrodeposition processes. A planarization process is performed to expose the top surface of dielectric material 310.

A dielectric material 311 is deposited over the top surface of dielectric material 310. In some embodiments, dielectric material 310 is the same material as dielectric material 311. In some embodiments, dielectric material 310 is different from dielectric material 311. In some embodiments, dielectric materials 310 and 311 include silicon dioxide or another inorganic dielectric material. In some embodiments, dielectric materials 310 and 311 include low-k dielectric materials.

A third layer of patterning material is deposited over the top surface of dielectric material 311, and a pattern transferred thereto, wherein openings in the layer of patterning material correspond to locations of contacts 334 and 336 (see FIG. 3D). A third etch process is performed to expose a top surface of contacts 328, 330, and 332, and a portion of dielectric material 310 between contacts 328 and 330. A conductive material is deposited into the openings formed by the third etch process, and a planarization process is performed to expose a top surface of dielectric material 311. In some embodiments, the conductive material includes cobalt, titanium, tungsten, platinum, palladium, nickel, and ruthenium, and alloys thereof, or other conductive material suitable for contacts or conductive lines in an interconnect structure.

FIGS. 4A-4E are cross-sectional views of a semiconductor device 400 during a manufacturing process, in accordance with some embodiments. Elements of semiconductor device 300 which have a similar structure, function, and position as elements of semiconductor device 300 have a same identifying numeral, incremented by 100. The following description uses a transistor as an example of the semiconductor device 400. However, one of ordinary skill in the art would recognize that the current disclosure is not limited to a transistor.

Figure 4A:
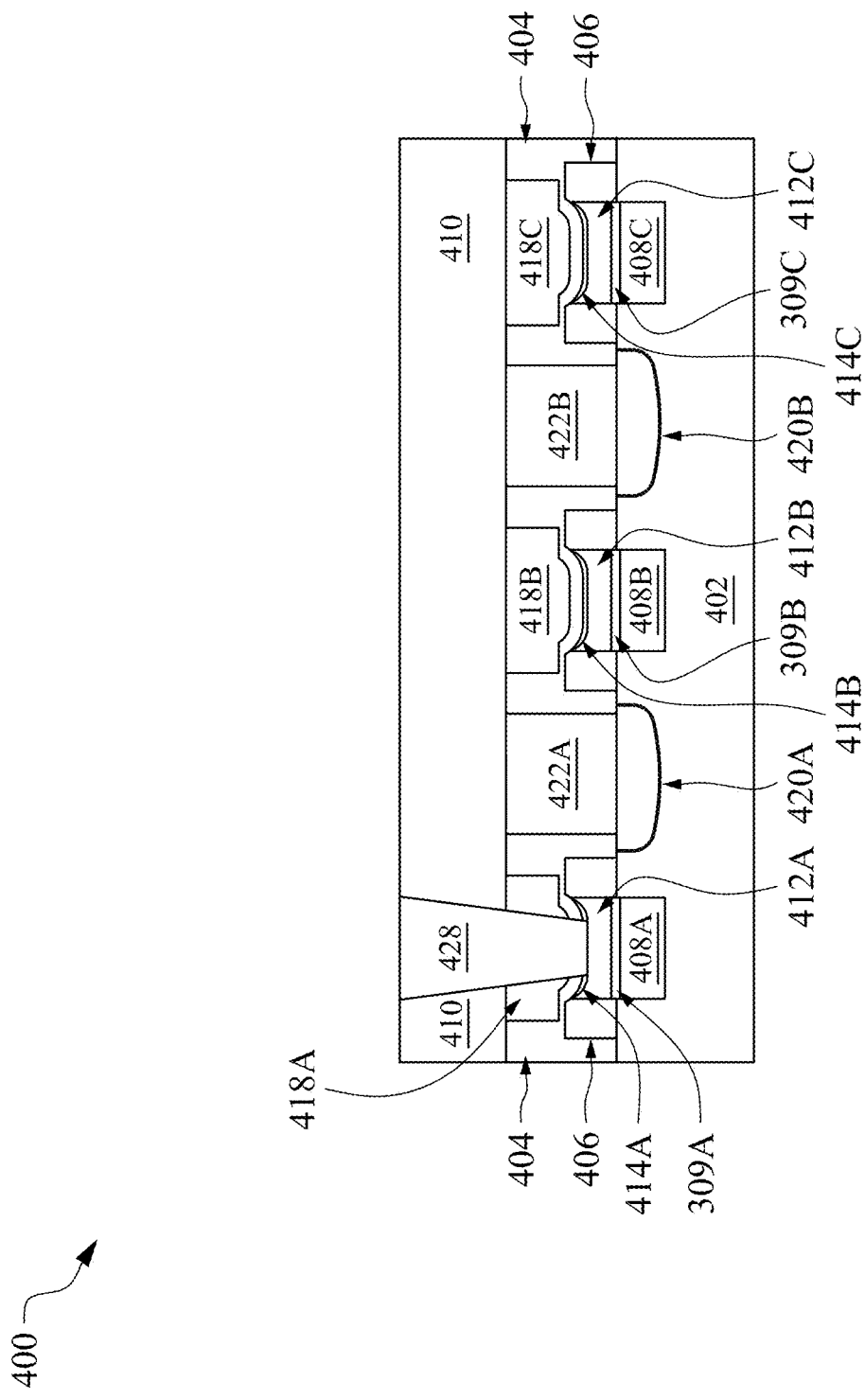
FIGS. 4A-4E are cross-sectional views of a semiconductor device during a manufacturing process, in accordance with some embodiments.

In comparison with the structure of FIG. 3A, the semiconductor device 400 in FIG. 4A includes gate contact 428 extending through second layer of dielectric material 410, self-aligned contact 418A, and electrically connected to gate electrode 412A. In some embodiments, FIG. 4A is a view of a semiconductor device following operation 204 of the method 200 (FIG. 2).

Figure 4B:
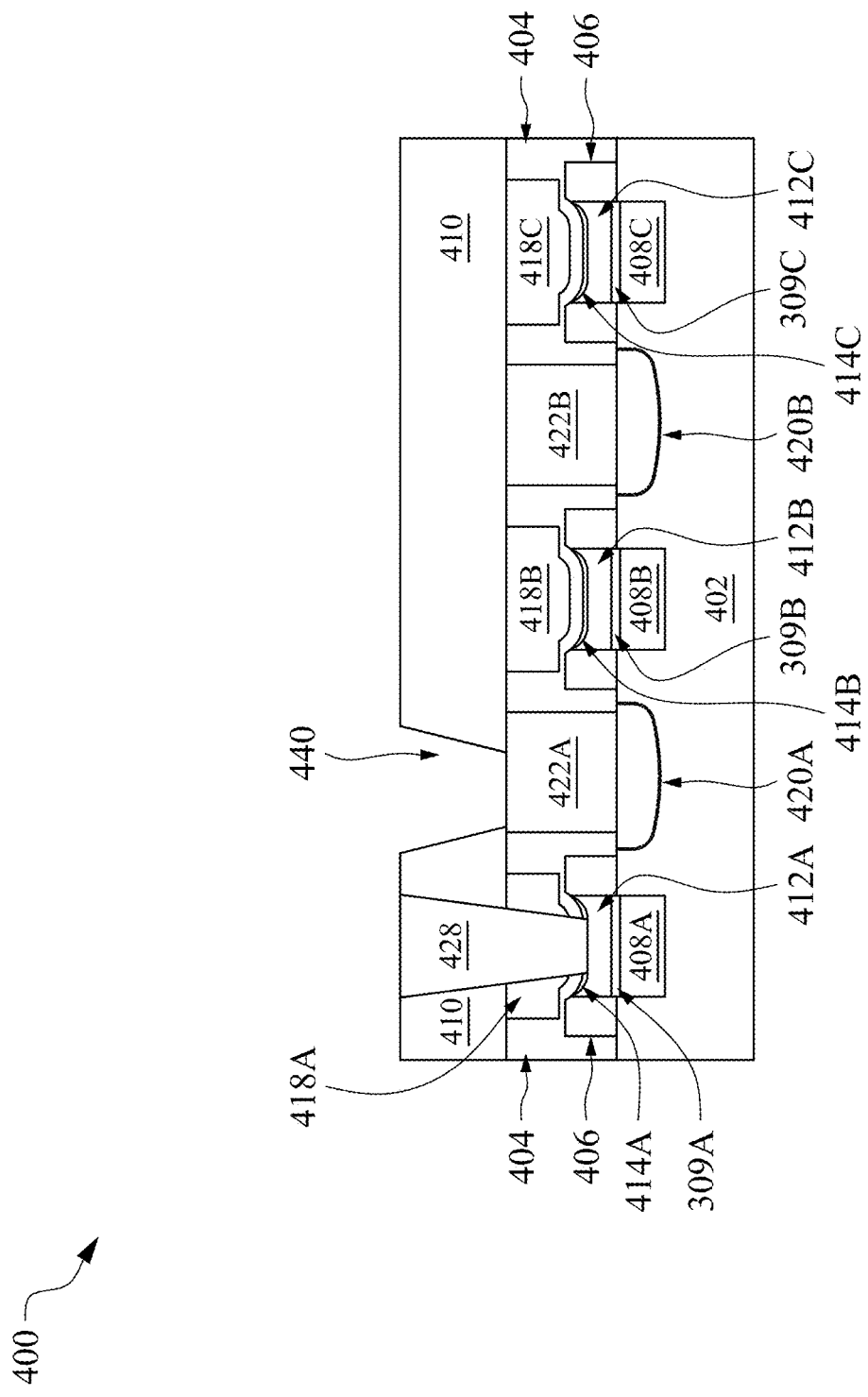

In FIG. 4B, a source/drain contact opening 440 extends through second layer of dielectric material to expose a top surface of SD electrode 422A. A description of an etch process to form a contact opening to expose a top surface of a SD electrode is provided above in operation 208 of method 200 (FIG. 2) in accordance with some embodiments. A non-limiting example of a manufacturing process for semiconductor device 400, as described in FIGS. 4B-4E, is analogous to the non-limiting example provided above in the description of manufacturing semiconductor device 300 in FIGS. 3A-3D. A distinguishing feature between semiconductor device 300 and semiconductor device 400, as described herein, is that the DOLM 326 for semiconductor device 300 extends around a contact 328, which electrically connects to a gate electrode 312A. In semiconductor device 400, DOLM 442 extends around a SD electrode 422A, rather than a gate electrode. In semiconductor device 400, the contacts to gate electrodes do not have DOLM structures.

Figure 4C:
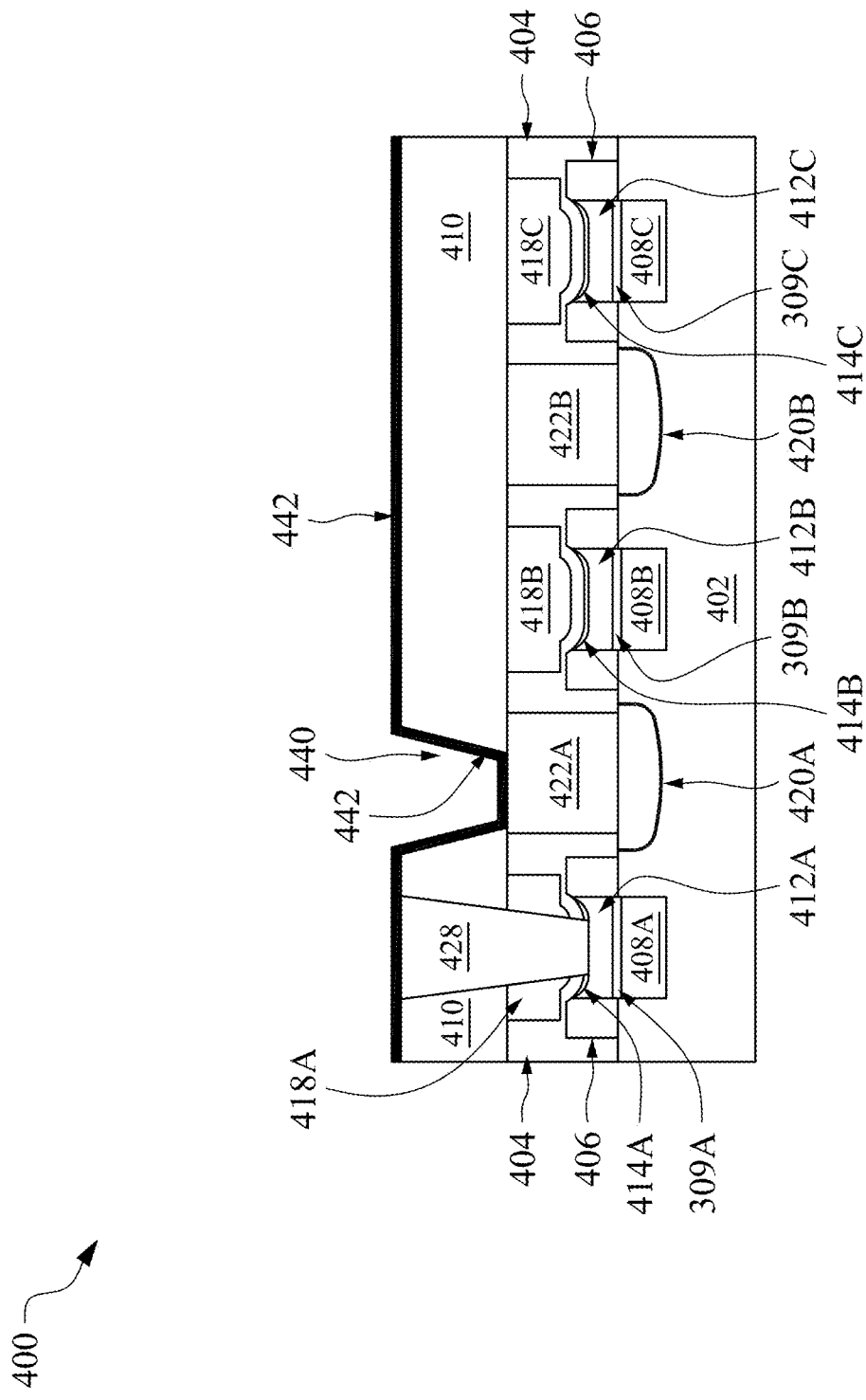

In FIG. 4C, a DOLM 442 covers a top surface of second layer of dielectric material 410, sidewalls of the source/drain contact opening 440, and the top surface of SD electrode 422A exposed by the source/drain contact opening 440. A description of deposition process to form the dimension offset liner material 442 on sidewalls of a contact opening is provided above in operation 208 of method 200 (FIG. 2) in accordance with some embodiments.

Figure 4D:
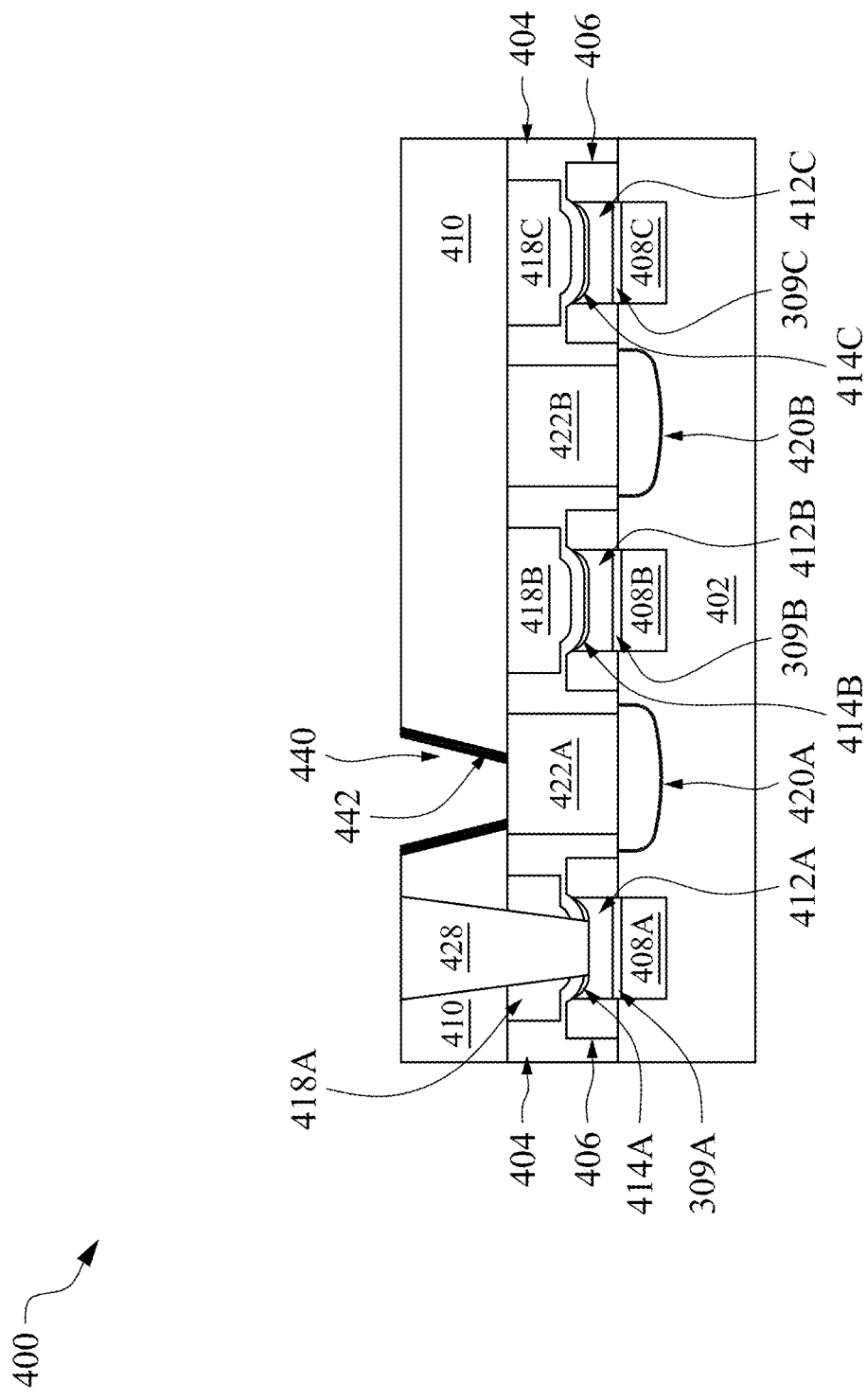

In FIG. 4D, the DOLM 442 has been etched to remove the portion of the dimension offset liner material over the top surface of second layer of dielectric material 410 and the top surface of SD electrode 422A. Description of an etch process to remove the portions of dimension offset liner material 442 on the top surface of the second layer of dielectric material 410 and the top surface of SD electrode 422A is provided above in operation 216 of method 200 (FIG. 2) in accordance with some embodiments.

Figure 4E:
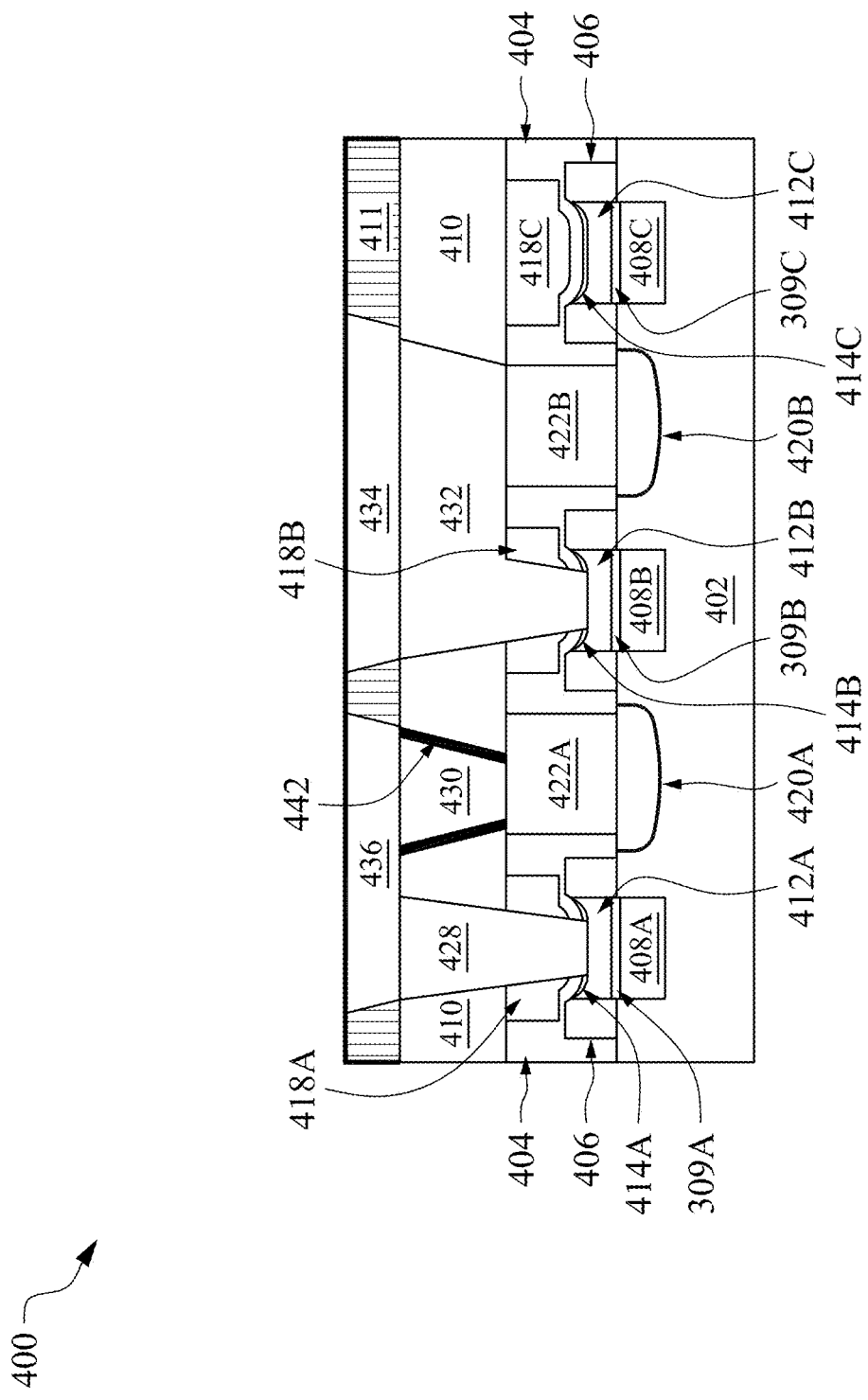

In FIG. 4E, conductive material has been deposited into source/drain contact opening 440 to form SD contact 430. Dimension offset liner material 442 is between SD contact and second layer of dielectric material 410. Conductive material has also been deposited into a second contact opening to form combined contact 432, which electrically connects to both gate electrode 412B and SD electrode 422B. Combined contact 432 electrically connects to conductive line 434. Gate contact 428 and SD contact 430 electrically connect to conductive line 436. In some embodiments, FIG. 4E is a view of a semiconductor device following operation 216 of the method 200 (FIG. 2).

According to some embodiments, a third layer of dielectric material 411 is deposited over a top surface of second layer of dielectric material 410 and openings are etched therein in order to form conductive line openings into which conductive material is deposited to form conductive line 434 electrically connected to gate contact 428 and SD contact 430; and to form conductive line 436 electrically connected to combined contact 432.

Figure 5B:
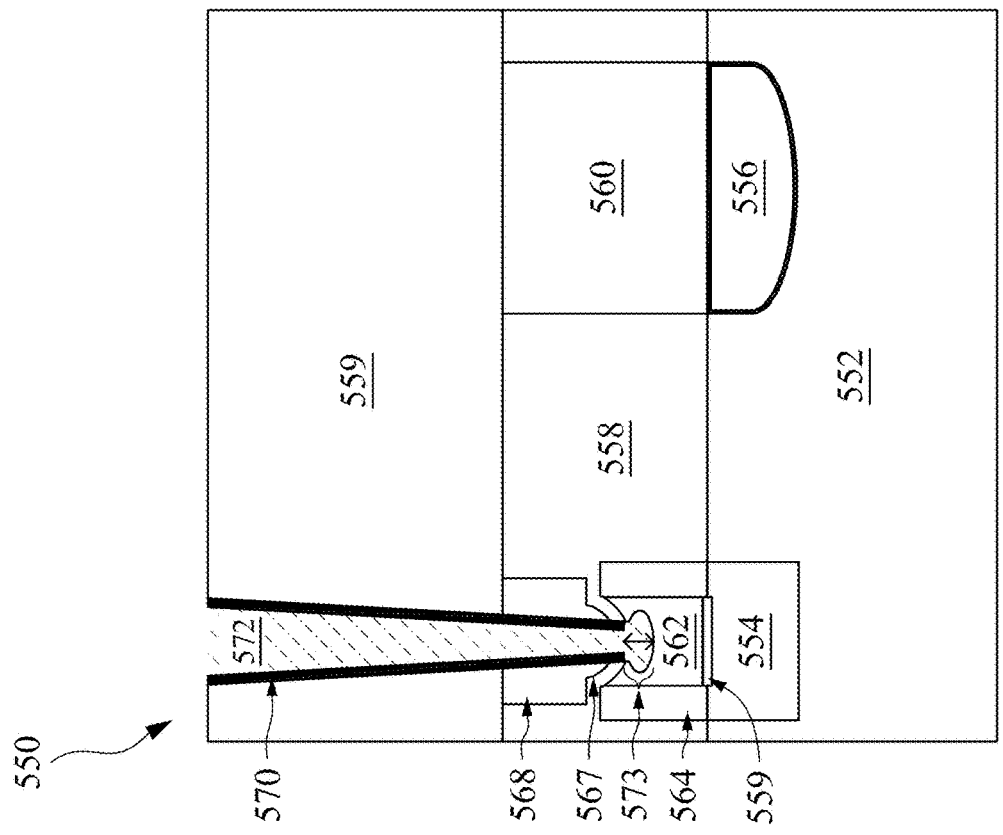
FIGS. 5A-5B are cross-sectional views of a semiconductor device in accordance with some embodiments.
Figure 5A:
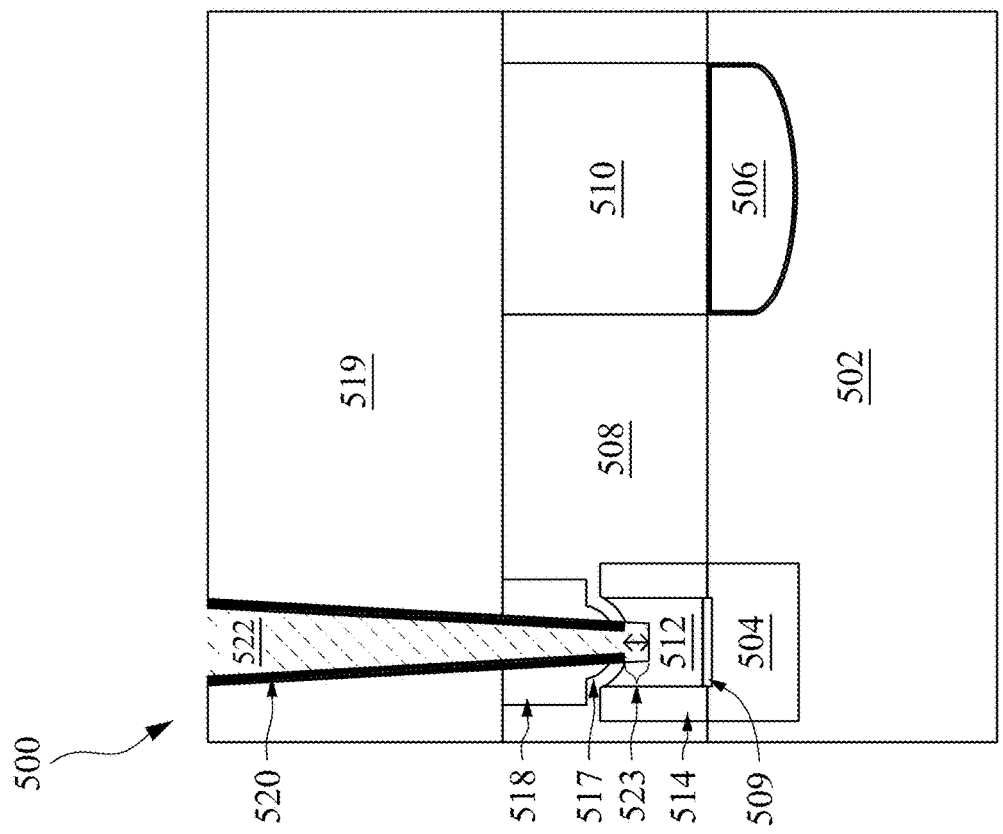

FIGS. 5A-5B are cross-sectional views of a semiconductor device, in accordance with some embodiments. The following description uses a transistor as an example of the semiconductor device 500. However, one of ordinary skill in the art would recognize that the current disclosure is not limited to a transistor.

In FIG. 5A, a semiconductor device 500 includes a semiconductor material 502 which has a channel region 504 and an SD region 506 located therein. A gate electrode 512 is over the channel region 504, and a gate dielectric material 509 is between the gate electrode 512 and the channel region 504. Spacers 514 are at the sides of the gate electrode 512. A CESL 517 is over the top surface of the gate electrode 512 and the spacers 514. A self-aligned contact 518 is in electrical contact with the CESL 517. A first dielectric material 508 extends over a top surface of the semiconductor material 502. An SD electrode 510 extends through the first dielectric material 508 to electrically connect with SD region 506. Second dielectric material 519 is over first dielectric material 508. A gate electrode contact 522 extends through second dielectric material 519, self-aligned contact 518, and contact etch stop layer 517 to electrically connect to gate electrode 512. A DOLM 520 extends along sidewalls of the gate electrode contact 522 between gate electrode contact 522 and second dielectric material 519 and self-aligned contact 518. DOLM 520 has a profile which substantially conforms to the profile of the sidewall of the opening into which DOLM 520 is deposited. Thus, DOLM 520 has a straight sidewall, corresponding to the profile of the sidewall of Second dielectric material 519.

Gate electrode contact 522 includes an extension region 523 which extends below the end of the DOLM 520 and into the gate electrode 512. Extension region 523 of gate electrode contact 522 is a "straight" extension of the gate electrode contact, formed by an anisotropic etch process (see, for example, operation 212 of method 200 described above) through a gate contact opening before the conductive material of gate electrode contact 522 is deposited into the gate contact opening. A "straight" extension formed by an anisotropic etch process, does not substantially undercut the DOLM in the SD electrode 510.

In FIG. 5B, elements of the semiconductor device 550 which have a same structure, function, and location as an element of semiconductor device 500 have a same identifying numeral incremented by 50.

In semiconductor device 550, gate electrode contact 572 includes an extension region 573 which extends below the end of the DOLM 570 and into the gate electrode 562. Extension region 573 of gate electrode contact 572 is a "rounded" extension of the gate electrode contact formed by an isotropic etch process (see, for example, operation 212 of method 200 described above) through a gate contact opening before the conductive material of gate electrode contact 522 is deposited into the gate contact opening. Unlike extension region 523 of semiconductor device 500, extension region 573 undercuts the end of DOLM 570 to further increase the interface between the gate electrode contact 572 and the gate electrode 562.

FIGS. 6A-6B are cross-sectional views of a semiconductor device in accordance with some embodiments. The following description uses a transistor as an example of the semiconductor device 600. However, one of ordinary skill in the art would recognize that the current disclosure is not limited to a transistor.

In FIG. 6A, a semiconductor device 600 includes a SD contact 625 electrically connected to SD electrode 610. Elements of semiconductor device 600 which have a similar structure and function as elements of semiconductor device 500 have a same identifying numeral incremented by 100. SD contact 625 has an extension region 623 which extends below a top surface of SD electrode 610 thereby increasing the surface area of an interface 624 between SD contact 625 and SD electrode 610. In semiconductor device 600, extension region 623 of SD contact 625 is a "straight" extension region formed by an anisotropic etch process, as described above in operation 212 of method 200 (FIG. 2). DOLM 620 has a profile which substantially conforms to the profile of the sidewall of the opening into which DOLM 620 is deposited. Thus, DOLM 560 has a straight sidewall, corresponding to the profile of the sidewall of Second dielectric material 619.

In FIG. 6B, a semiconductor device 650 includes an SD contact 675 electrically connected to an SD electrode 660. Elements of semiconductor device 650 which have a similar structure and function as elements of semiconductor device 600 have a same identifying numeral incremented by 50. DOLM 670 has a profile which substantially conforms to the profile of the sidewall of the opening into which DOLM 670 is deposited. Thus, DOLM 670 has a straight sidewall, corresponding to the profile of the sidewall of second dielectric material 669.

Extension region 673 of SD contact 675 is a "rounded" extension region, formed by an isotropic etch process, as described above in operation 212 method 200. An isotropic etch process etches in material in approximately equal rates in all directions, extension region 673 extends below the bottom end of dimension offset liner material 670 along sidewalls of SD contact 675. In some embodiments, a "rounded" extension region such as extension region 673 undercuts the edge of DOLM 670 and removes material from the SD electrode 660 which is in contact with a second layer of dielectric material such as second layer of dielectric material 669. In semiconductor device 650, the "rounded" extension region 673 has a larger interface 674 between SD contact 675 and SD electrode 660 and is found in semiconductor device 600 where the interface 624 between SD contact 625 and SD electrode 610 is smaller than interface 674.

Both a "straight" extension region and a "rounded" extension region increase the surface area of an interface between a contact and a transistor electrode thereby reducing the resistance between the contact and the transistor electrode, reducing power consumption for the semiconductor device during operation.

Aspects of the present disclosure relate to a method of making a semiconductor device, the method including steps for forming a conductive element over a substrate; depositing a layer of dielectric material over the conductive element; etching the layer of dielectric material to define an opening, wherein a dimension of the opening adjacent the conductive element has a first width measured in a direction parallel to a top surface of the substrate; reducing the first width by depositing a dielectric liner in the opening; etching the dielectric liner to expose a portion of the conductive element, wherein a dimension of the conductive element exposed has a second width less than the first width; and depositing a conductive material in the opening, wherein the dielectric layer is between the conductive material and the layer of dielectric material, and the conductive material is electrically connected to the conductive element. In some embodiments, the method includes etching the conductive element through the opening to define a recess in the conductive element, wherein depositing the conductive material includes depositing the conductive material into the recess in the conductive element. In some embodiments, the etching the conductive element includes anisotropically etching the conductive element. In some embodiments, the etching the conductive element includes isotropically etching the conductive element. In some embodiments, depositing the dielectric liner includes depositing the dielectric liner into the recess in the conductive element. In some embodiments, depositing the dielectric liner includes depositing the dielectric liner having a uniform thickness along sidewalls of the layer of dielectric material. In some embodiments, the method includes removing a portion of the dielectric liner in the opening and distal from the conductive element. In some embodiments, depositing the dielectric liner includes depositing the dielectric liner having a thickness between 0.5 nanometers (nm) and 10 nm. In some embodiments, depositing the dielectric liner includes depositing the dielectric liner including silicon oxide, silicon nitride, silicon oxynitride, or silicon carbide. In some embodiments, depositing the conductive material includes depositing a metal selected from the group consisting of cobalt, titanium, tungsten, platinum, palladium, nickel, and ruthenium.

Aspects of the present disclosure relate to a method of making a semiconductor device, including: manufacturing a conductive element in a substrate; depositing a layer of dielectric material over the conductive element; etching an opening through the layer of dielectric material to expose a top surface of the conductive element; depositing a liner over the layer of dielectric material and an exposed portion of the conductive element; etching the liner to expose the top surface of the conductive element; etching the conductive element to form a recess in the conductive element; and depositing a conductive material in the recess in the conductive element and in the opening through the layer of dielectric material. In some embodiments, depositing the liner over the layer of dielectric material further includes depositing a liner material with a liner thickness of not less than 0.5 nanometers (nm) and not more than 5 nm. In some embodiments, depositing the liner over the layer of dielectric material further includes performing an atomic layer deposition process. In some embodiments, depositing the liner over the layer of dielectric material further includes performing an epitaxial deposition process. In some embodiments, depositing the liner over the layer of dielectric material further includes depositing a dielectric material. In some embodiments, etching the liner to expose a top surface of the layer of dielectric material further includes leaving a remainder of liner on a sidewall of the opening. In some embodiments, etching the liner further includes exposing a top surface of the layer of dielectric material outside the opening through the layer of dielectric material.

Aspects of the present disclosure relate to a device which includes a conductive element at least partially in a substrate; a dielectric material over the conductive element; a contact electrically connecting to the conductive element; and a dielectric liner between the contact and the dielectric material, wherein the dielectric liner has a liner thickness of not less than 0.5 nanometers (nm) and not greater than 10 nm. In some embodiments, the contact extends into the conductive element. In some embodiments, the contact extends under a bottom-most surface of the dielectric liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, the method comprising:
    forming a conductive element over a substrate;
    depositing a layer of dielectric material over the conductive element;
    etching the layer of dielectric material to define an opening, wherein a dimension of the opening adjacent the conductive element has a first width measured in a direction parallel to a top surface of the substrate;
    reducing the first width by depositing a dielectric liner in the opening;
    etching the dielectric liner to expose a portion of the conductive element, wherein a dimension of the conductive element exposed has a second width less than the first width, and etching the dielectric liner defines the etched dielectric liner having:
        a lower portion having a substantially uniform thickness measured in the direction parallel to the top surface of the substrate, and
        an upper portion having a variable thickness measured in the direction parallel to the top surface of the substrate; and
    depositing a conductive material in the opening, wherein the dielectric liner is between the conductive material and the layer of dielectric material, and the conductive material is electrically connected to the conductive element.

2. The method of claim 1, further comprising etching the conductive element through the opening to define a recess in the conductive element, wherein depositing the conductive material comprises depositing the conductive material into the recess in the conductive element.

3. The method of claim 2, wherein the etching the conductive element comprises anisotropically etching the conductive element.

4. The method of claim 2, wherein etching the conductive element comprises isotropically etching the conductive element.

5. The method of claim 2, wherein depositing the dielectric liner comprises depositing the dielectric liner into the recess in the conductive element.

6. The method of claim 1, wherein depositing the dielectric liner comprises depositing the dielectric liner having a uniform thickness along sidewalls of the layer of dielectric material.

7. The method of claim 1, further comprising removing a portion of the dielectric liner in the opening and distal from the conductive element.

8. The method of claim 1, wherein depositing the dielectric liner comprises depositing the dielectric liner having a thickness between 0.5 nanometers (nm) and 10 nm.

9. The method of claim 1, wherein depositing the dielectric liner comprises depositing the dielectric liner comprising silicon oxide, silicon nitride, silicon oxynitride, or silicon carbide.

10. The method of claim 1, wherein depositing the conductive material comprises depositing a metal selected from the group consisting of cobalt, titanium, tungsten, platinum, palladium, nickel, and ruthenium.

11. A method of making a semiconductor device, comprising:
- manufacturing a conductive element in a substrate;
- depositing a layer of dielectric material over the conductive element;
- etching an opening through the layer of dielectric material to expose a top surface of the conductive element;
- depositing a liner over the layer of dielectric material and an exposed portion of the conductive element;
- etching the liner to expose the top surface of the conductive element, wherein the etched liner has:
  - a first portion having a variable thickness measured in a direction parallel to a top surface of the substrate, and
  - a second portion having a substantially uniform thickness measured in the direction parallel to the top surface of the substrate; and
- etching the conductive element to form a recess in the conductive element.

12. The method of claim 11, wherein depositing the liner over the layer of dielectric material further comprises depositing a liner material with a liner thickness of not less than 0.5 nanometers (nm) and not more than 5 nm.

13. The method of claim 12, wherein depositing the liner over the layer of dielectric material further comprises performing an atomic layer deposition process.

14. The method of claim 12, wherein depositing the liner over the layer of dielectric material further comprises performing an epitaxial deposition process.

15. The method of claim 12, wherein depositing the liner over the layer of dielectric material further comprises depositing a dielectric material.

16. The method of claim 11, wherein etching the liner to expose a top surface of the layer of dielectric material further comprises leaving a remainder of liner on a sidewall of the opening.

17. The method of claim 11, wherein etching the liner further comprises exposing a top surface of the layer of dielectric material outside the opening through the layer of dielectric material.

18. A method of making a semiconductor device, the method comprising:
- depositing a dielectric layer over a conductive element;
- defining an opening in the dielectric layer to expose a first portion of the conductive element, wherein a dimension of the opening adjacent to the conductive element has a first width measured in a direction parallel to a top surface of the substrate, and a dimension of the opening distal from the conductive element has a second width;
- depositing a dielectric offset liner material (DOLM) in the opening;
- etching the DOLM to expose a second portion of the conductive element, wherein a dimension of the second portion conductive element has a third width less than the first width, and the etched DOLM includes a first portion having a substantially uniform thickness in the direction parallel to the top surface of the substrate; and
- removing a portion of the DOLM distal from the conductive element, wherein removing the portion of the DOLM defines a fourth width between inner sidewalls of the DOLM, wherein the fourth width is greater than the third width and less than or equal to the second width, wherein removing the portion of the DOLM defines a sloped upper sidewall of the DOLM where the DOLM has a variable thickness.

19. The method of claim 18, wherein removing the portion of the DOLM defines the fourth width equal to the second width.

* * * * *